United States Patent
Yun et al.

(10) Patent No.: US 8,258,517 B2
(45) Date of Patent: Sep. 4, 2012

(54) SEMICONDUCTOR DEVICE HAVING DRIVING TRANSISTORS

(75) Inventors: Jong-In Yun, Seoul (KR); Soon-Moon Jung, Gyeonggi-do (KR); Han-Soo Kim, Gyeonggi-do (KR); Hoo-Sung Cho, Gyeonggi-do (KR); Jun-Beom Park, Seoul (KR); Jae-Hun Jeong, Gyeonggi-do (KR)

(73) Assignee: Samsung Electronics Co., Ltd. (CN)

( * ) Notice: Subject to any disclaimer, the term of this patent is extended or adjusted under 35 U.S.C. 154(b) by 578 days.

(21) Appl. No.: 12/473,055

(22) Filed: May 27, 2009

(65) Prior Publication Data

US 2009/0294821 A1    Dec. 3, 2009

(30) Foreign Application Priority Data

May 27, 2008  (KR) .................. 10-2008-0049219

(51) Int. Cl.
*H01L 29/08*    (2006.01)
(52) U.S. Cl. .................. 257/67; 257/74; 257/E21.614; 365/185.17
(58) Field of Classification Search .................. 257/67, 257/74, E21.614; 365/185.17
See application file for complete search history.

(56) References Cited

U.S. PATENT DOCUMENTS

| | | | |
|---|---|---|---|
| 5,731,217 A * | 3/1998 | Kadosh et al. | ................ 438/300 |
| 5,949,092 A | 9/1999 | Kadosh et al. | |
| 6,314,021 B1 | 11/2001 | Maeda et al. | |
| 6,762,477 B2 | 7/2004 | Kunikiyo | |
| 6,882,010 B2 * | 4/2005 | Bhattacharyya | ................ 257/350 |
| 7,271,074 B2 | 9/2007 | Lerner et al. | |
| 7,315,466 B2 | 1/2008 | Han et al. | |
| 2001/0036109 A1 * | 11/2001 | Jha et al. | ................ 365/185.33 |
| 2007/0047371 A1 | 3/2007 | Park et al. | |
| 2007/0165455 A1 | 7/2007 | Park et al. | |
| 2007/0181880 A1 * | 8/2007 | Kim | ................ 257/67 |
| 2007/0297232 A1 * | 12/2007 | Iwata | ................ 365/185.17 |
| 2008/0031048 A1 | 2/2008 | Jeong et al. | |

FOREIGN PATENT DOCUMENTS

| | | |
|---|---|---|
| JP | 2001-025235 | 1/2001 |
| JP | 2002-368141 | 12/2002 |
| KR | 1020040038379 A | 5/2004 |
| KR | 10-0634459 | 10/2006 |
| KR | 10-2006-0116398 | 11/2006 |
| KR | 10-2008-0024764 | 3/2008 |
| KR | 1020080084291 A | 9/2008 |

* cited by examiner

*Primary Examiner* — Kenneth Parker
*Assistant Examiner* — Paul Budd
(74) *Attorney, Agent, or Firm* — Myers Bigel Sibley & Sajovec, P.A.

(57) ABSTRACT

One embodiment exemplarily described herein can be generally characterized as a semiconductor device that includes a lower level device layer located over a semiconductor substrate, an interlayer insulating film located over the lower level device layer and an upper level device layer located over the interlayer insulating film. The lower level device layer may include a plurality of devices formed in the substrate. The upper level device layer may include a plurality of semiconductor patterns and at least one device formed in each of the plurality of semiconductor patterns. The plurality of semiconductor patterns may be electrically isolated from each other. Each of the plurality of semiconductor patterns may include at least one active portion and at least one body contact portion electrically connected to the at least one active portion.

29 Claims, 24 Drawing Sheets

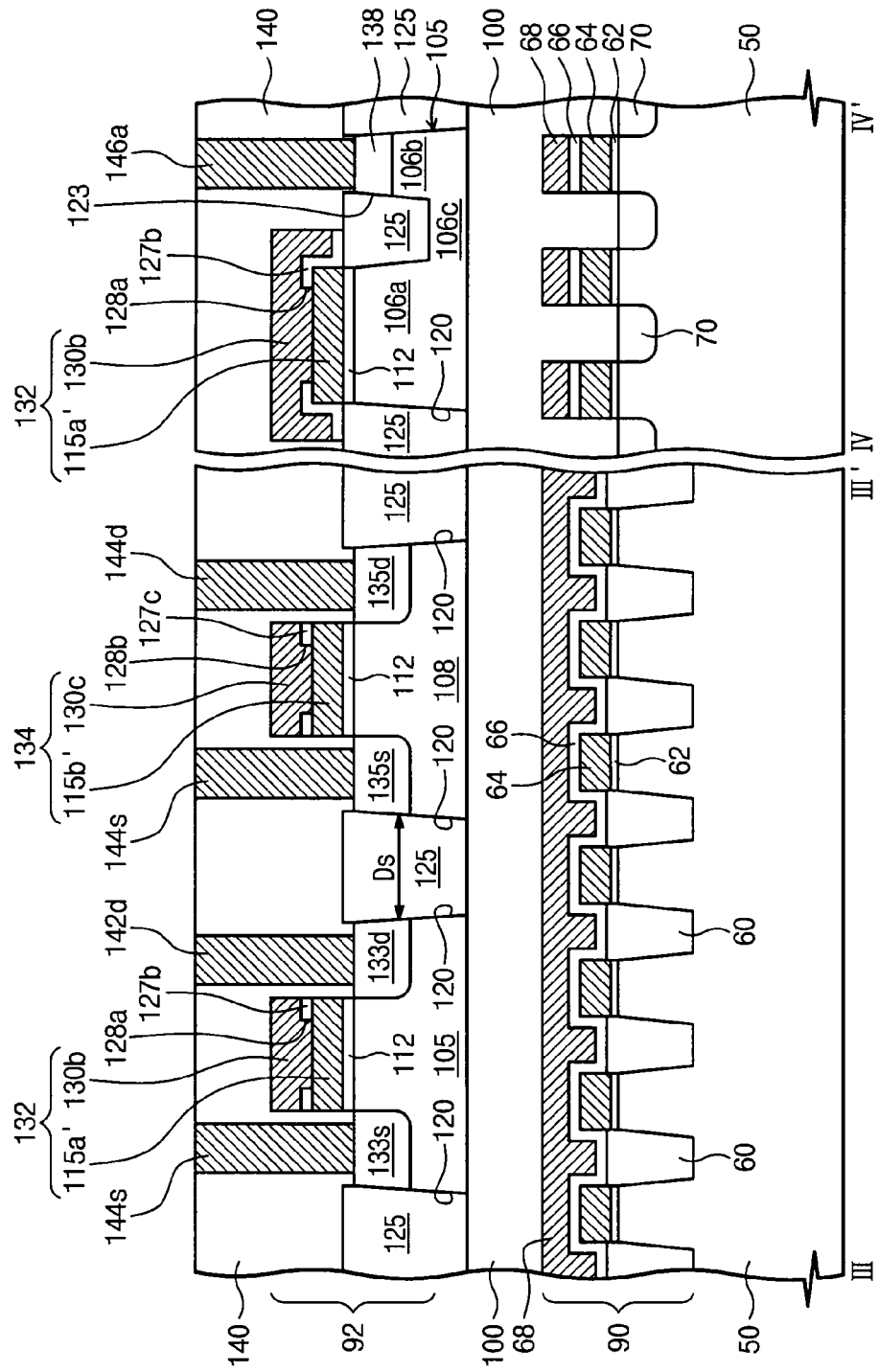

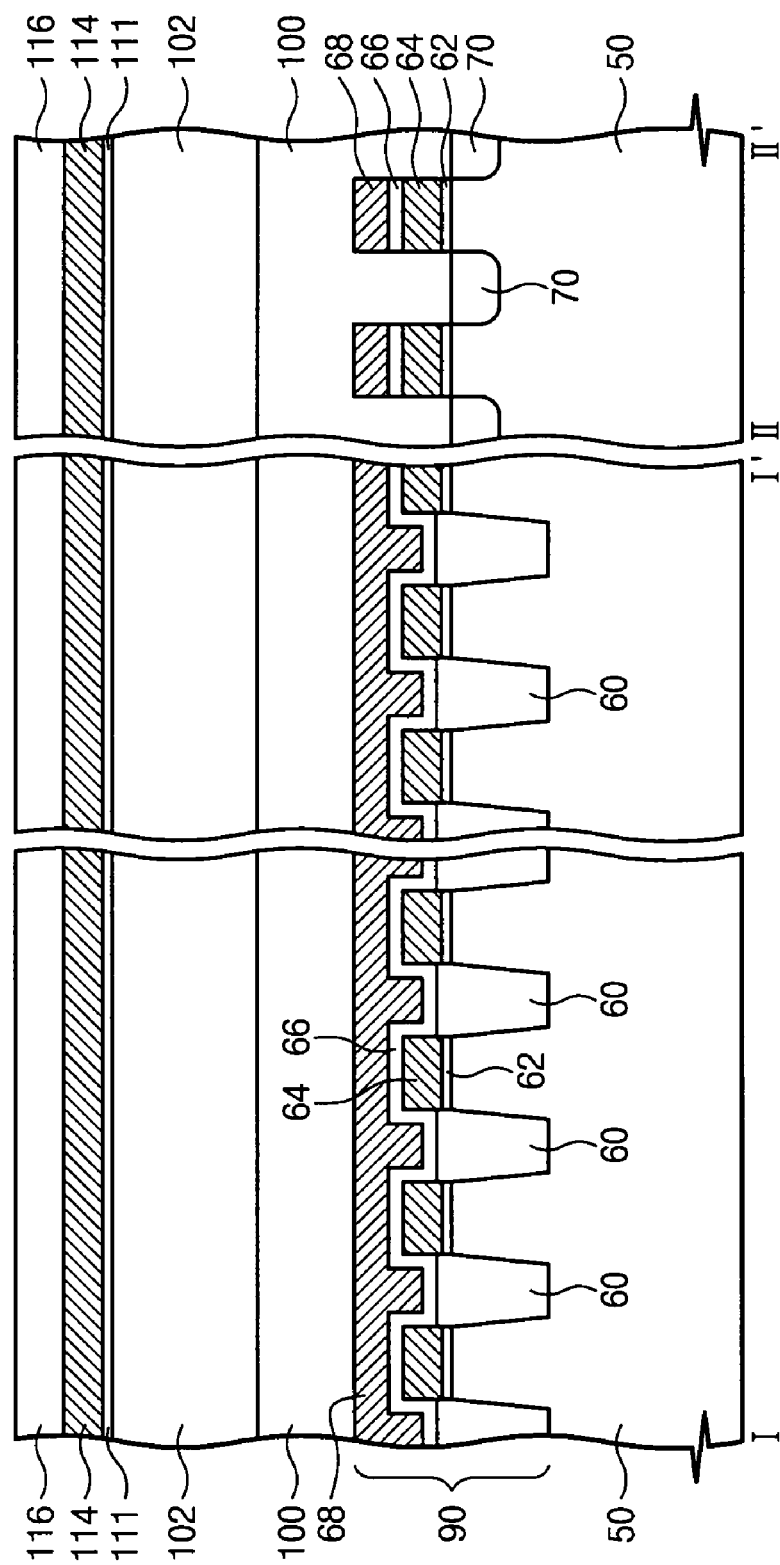

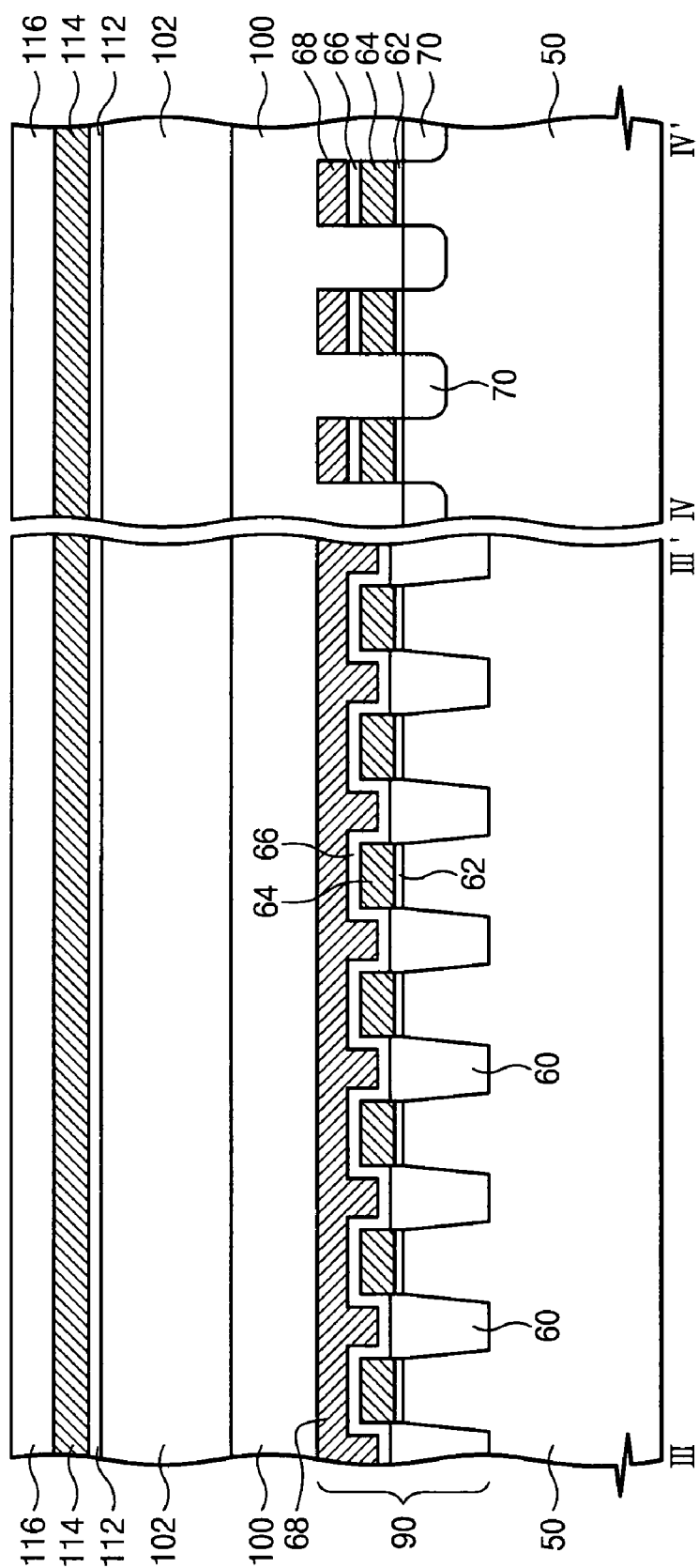

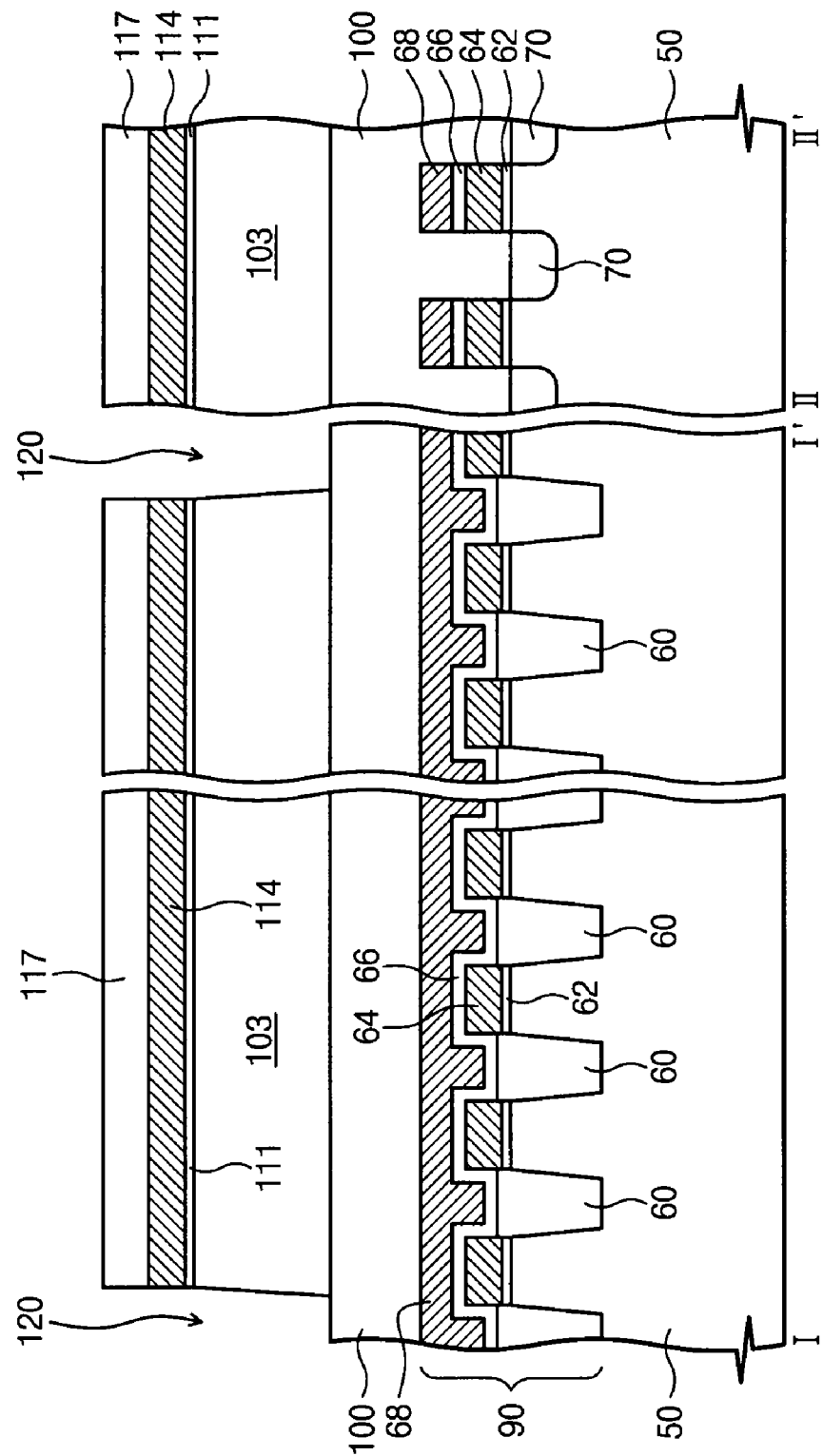

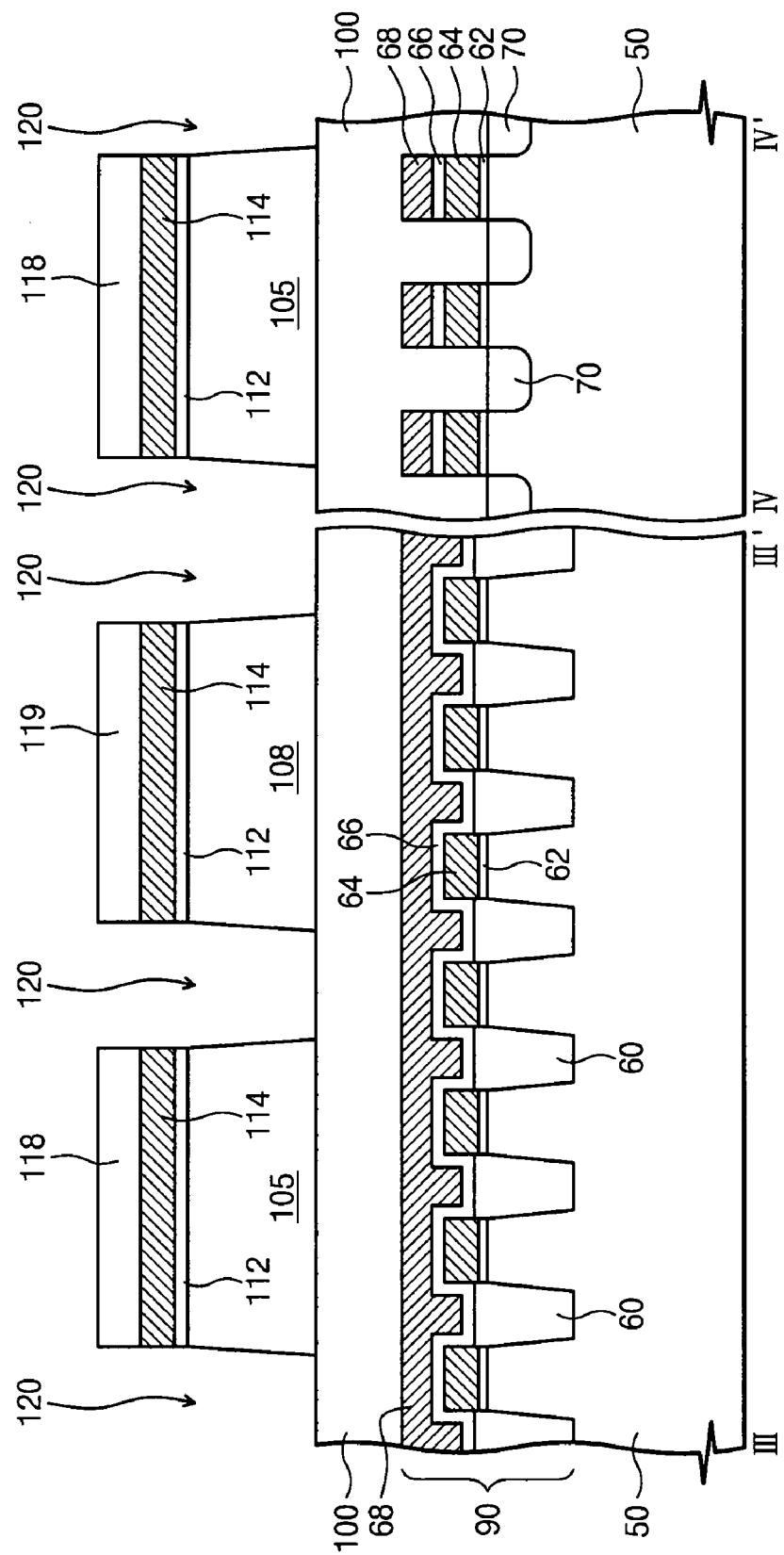

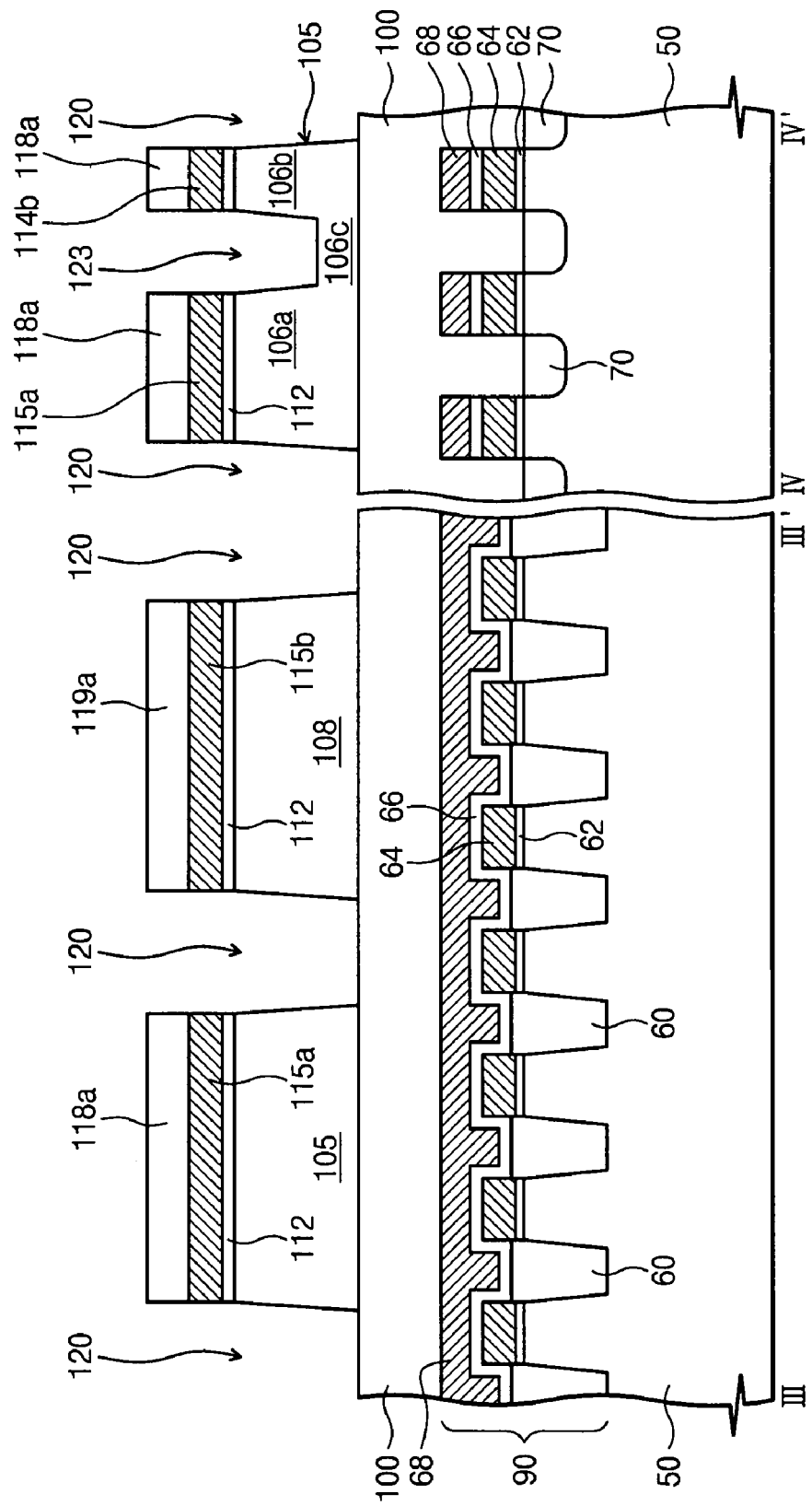

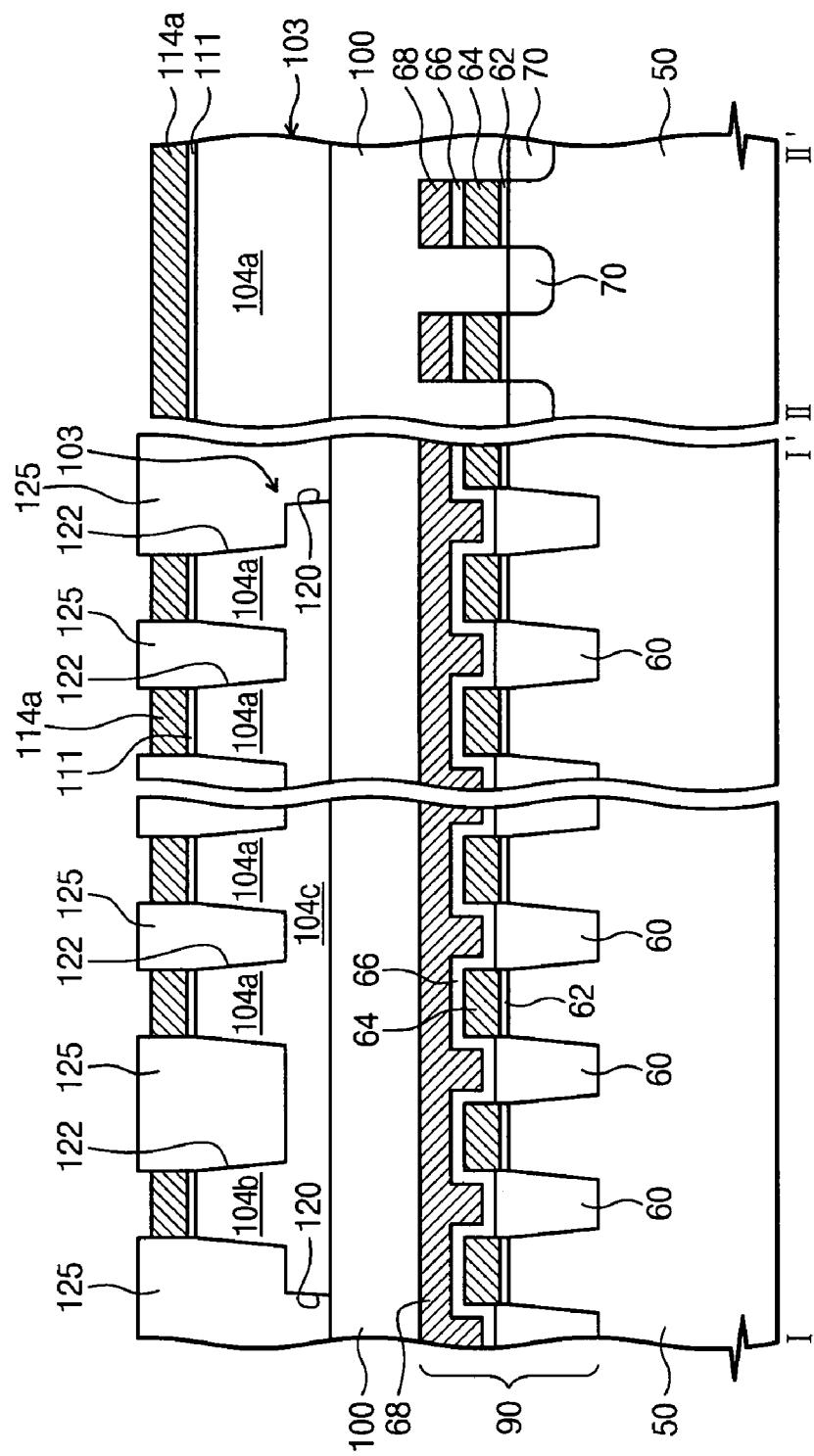

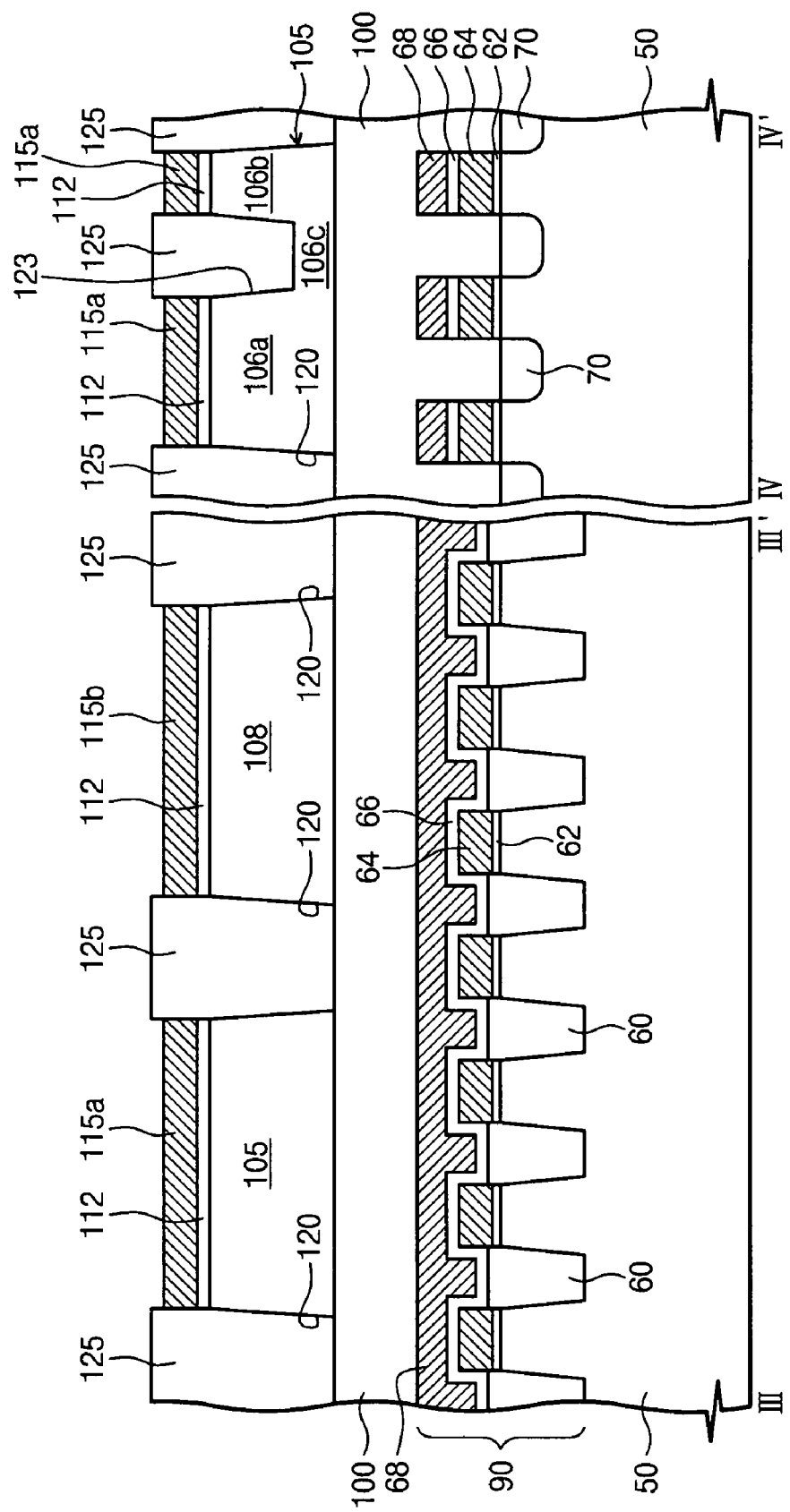

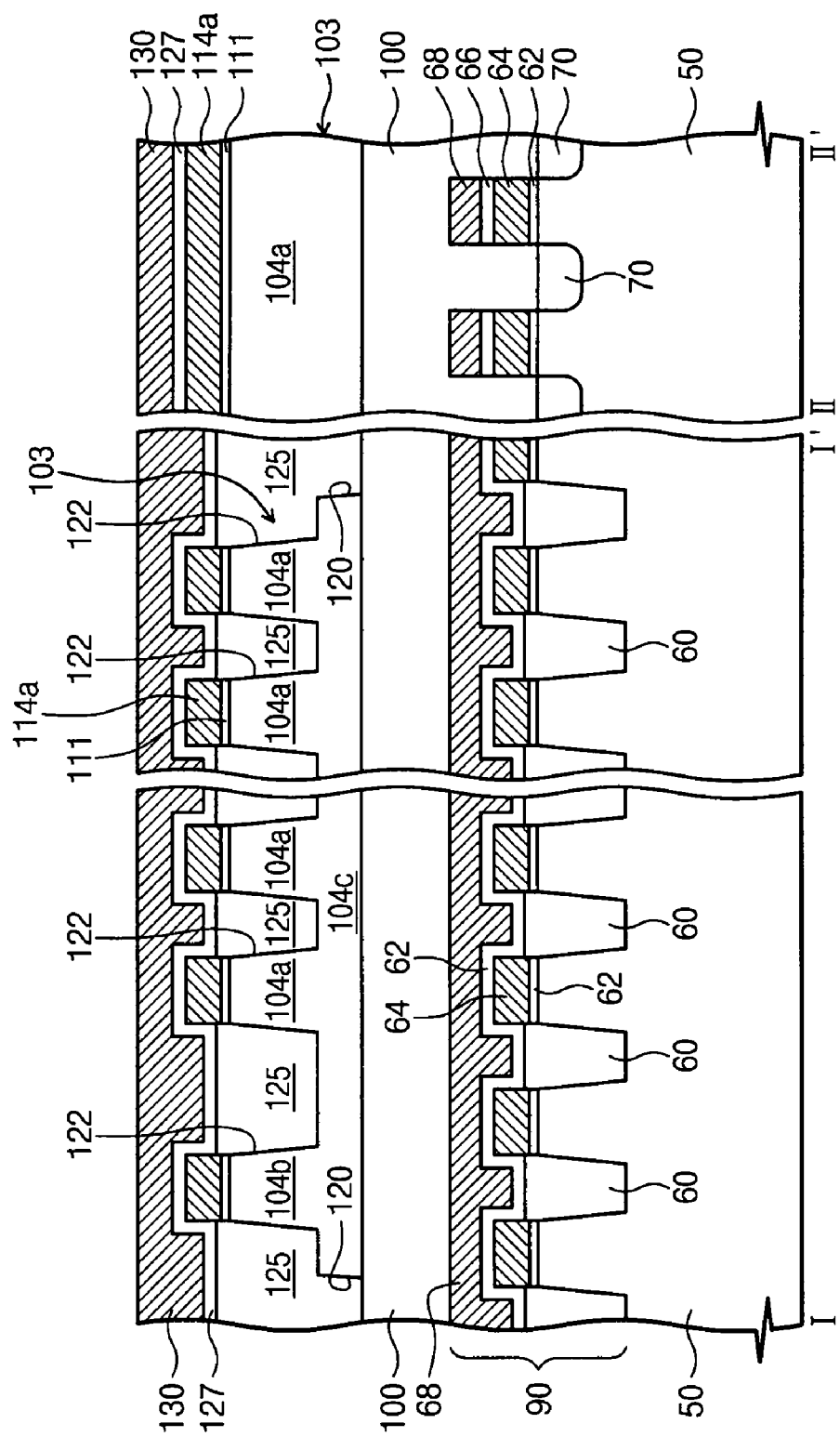

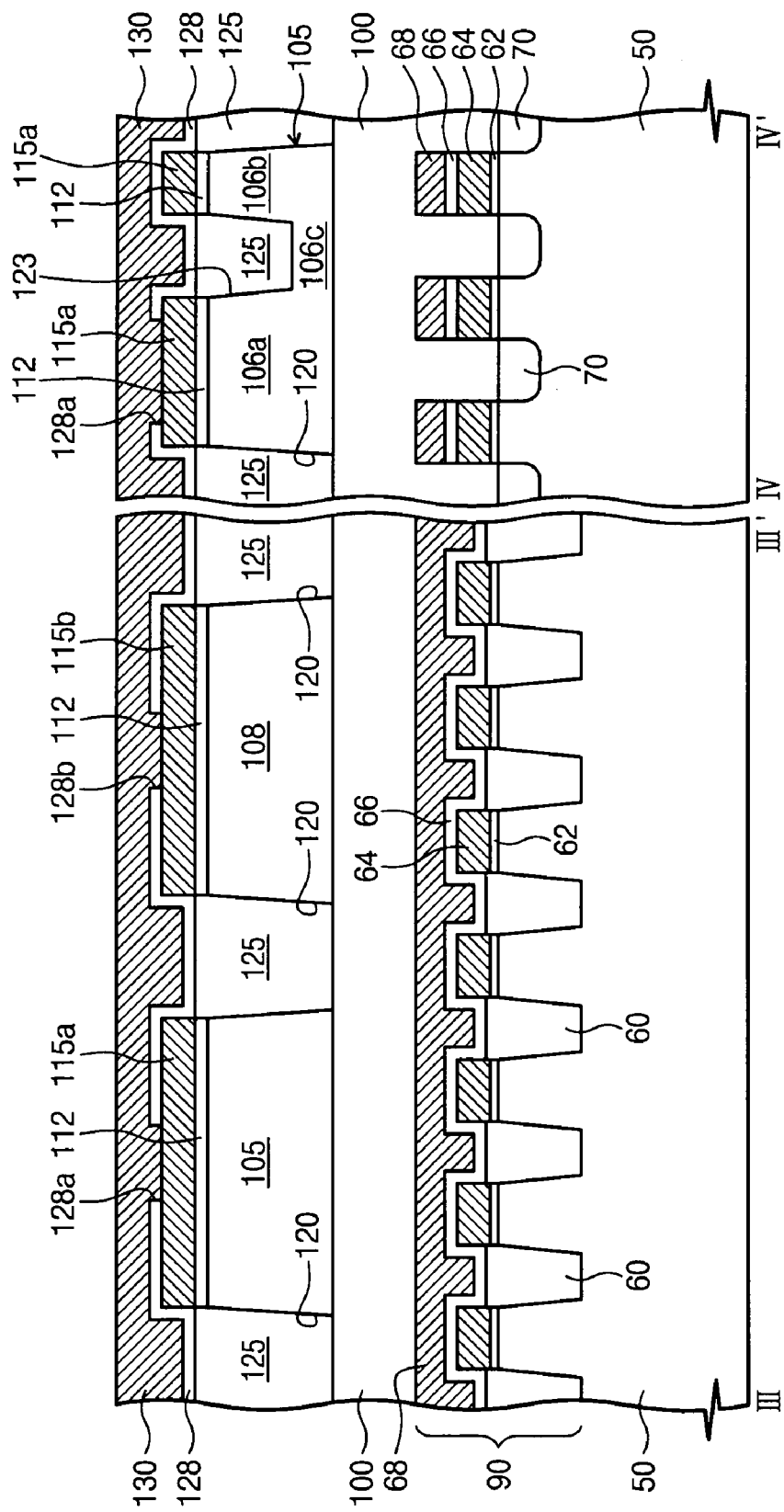

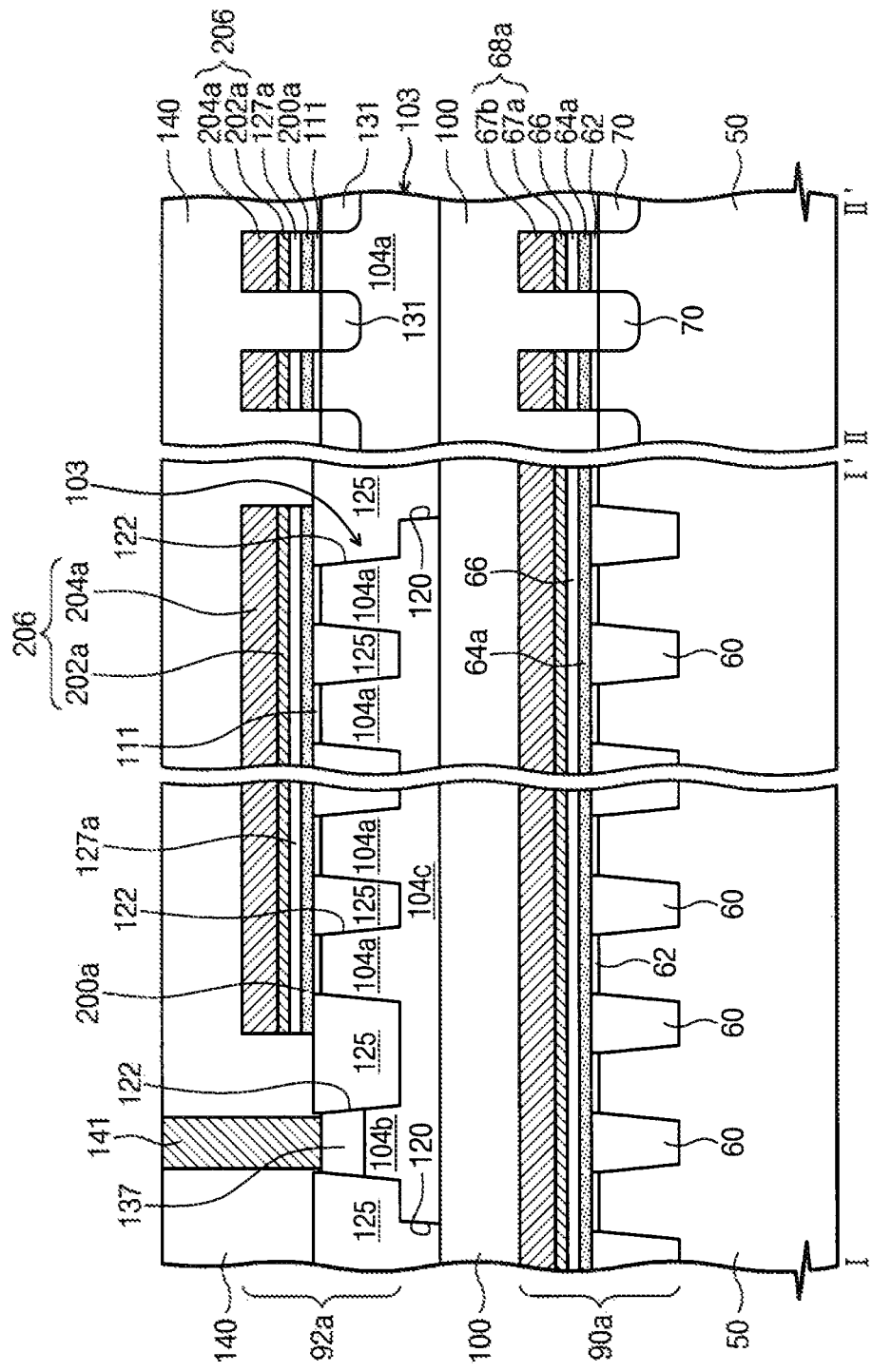

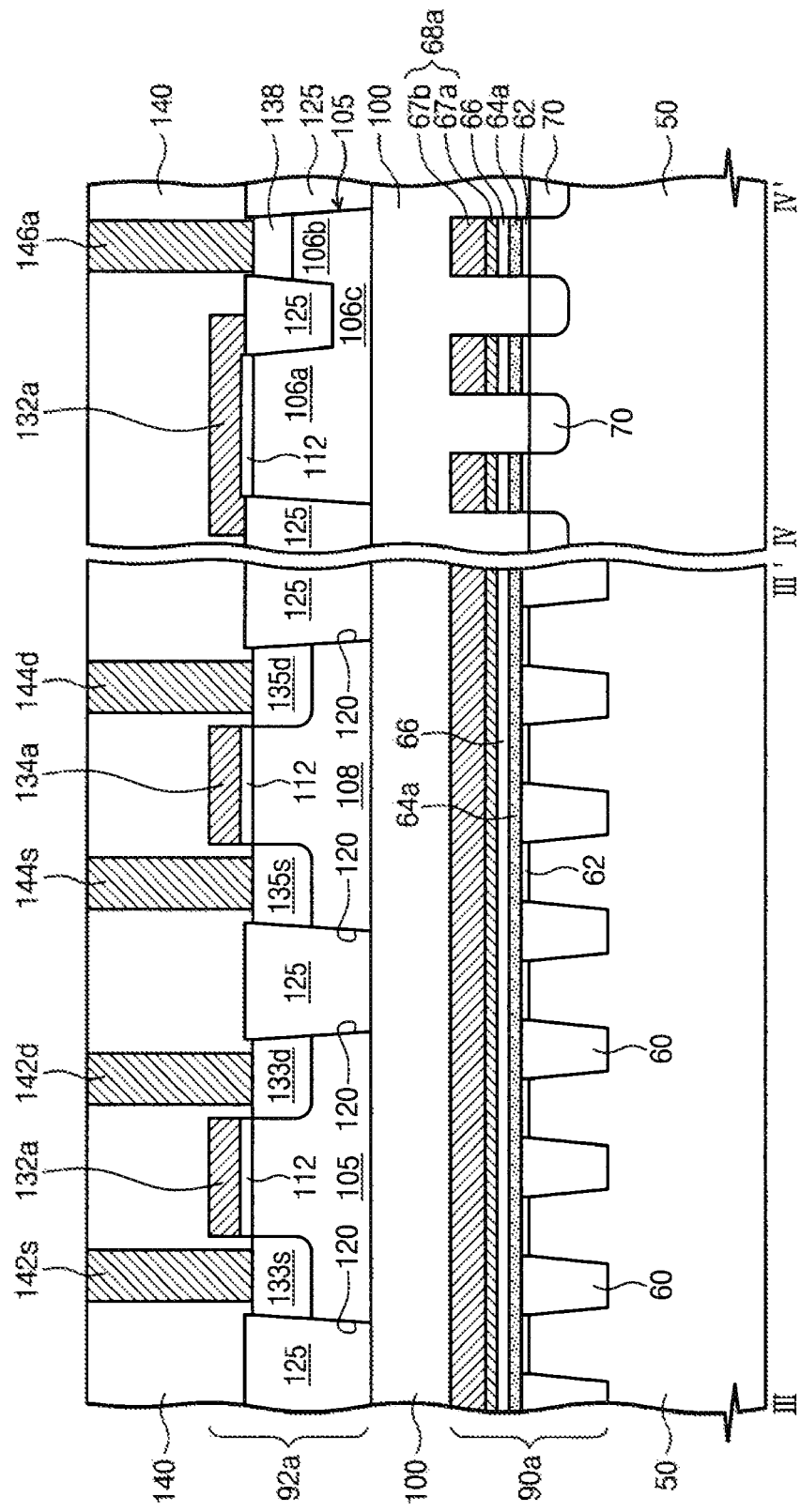

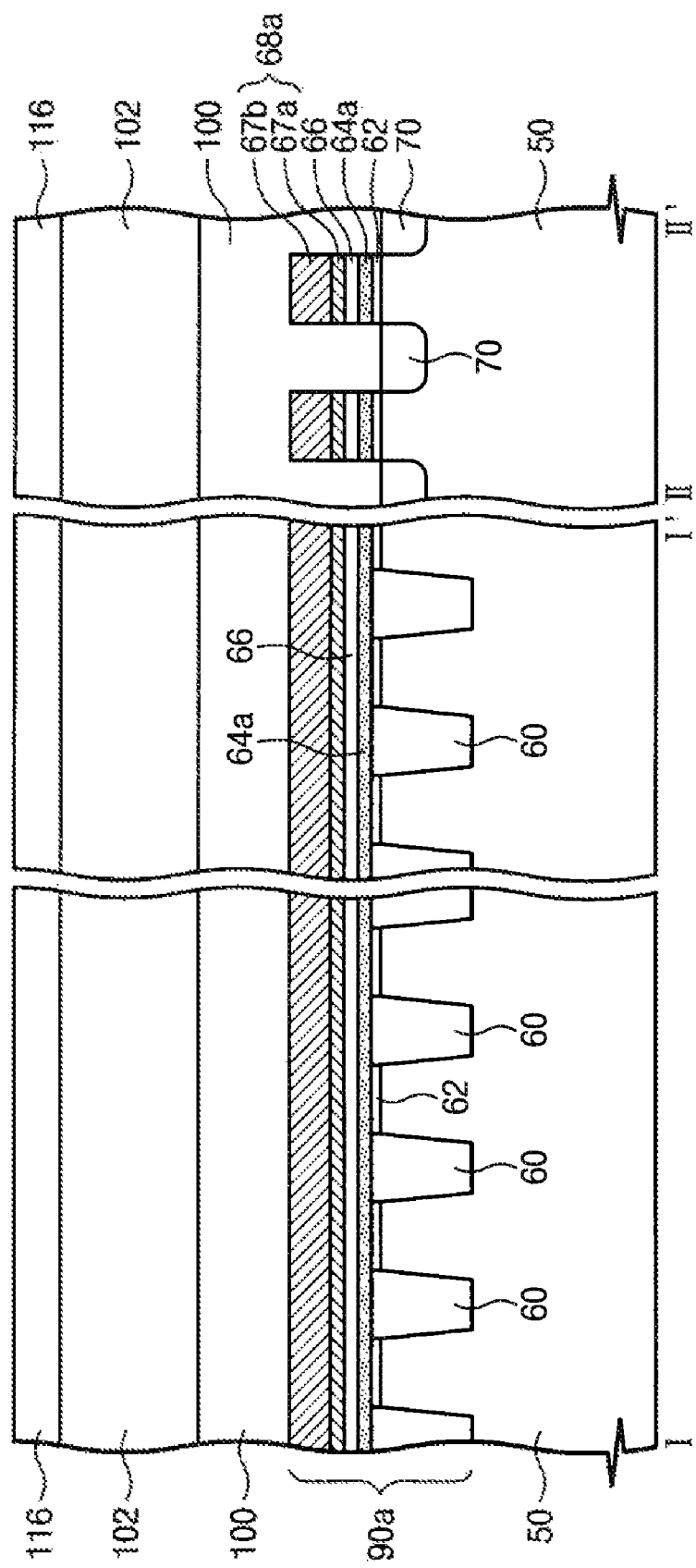

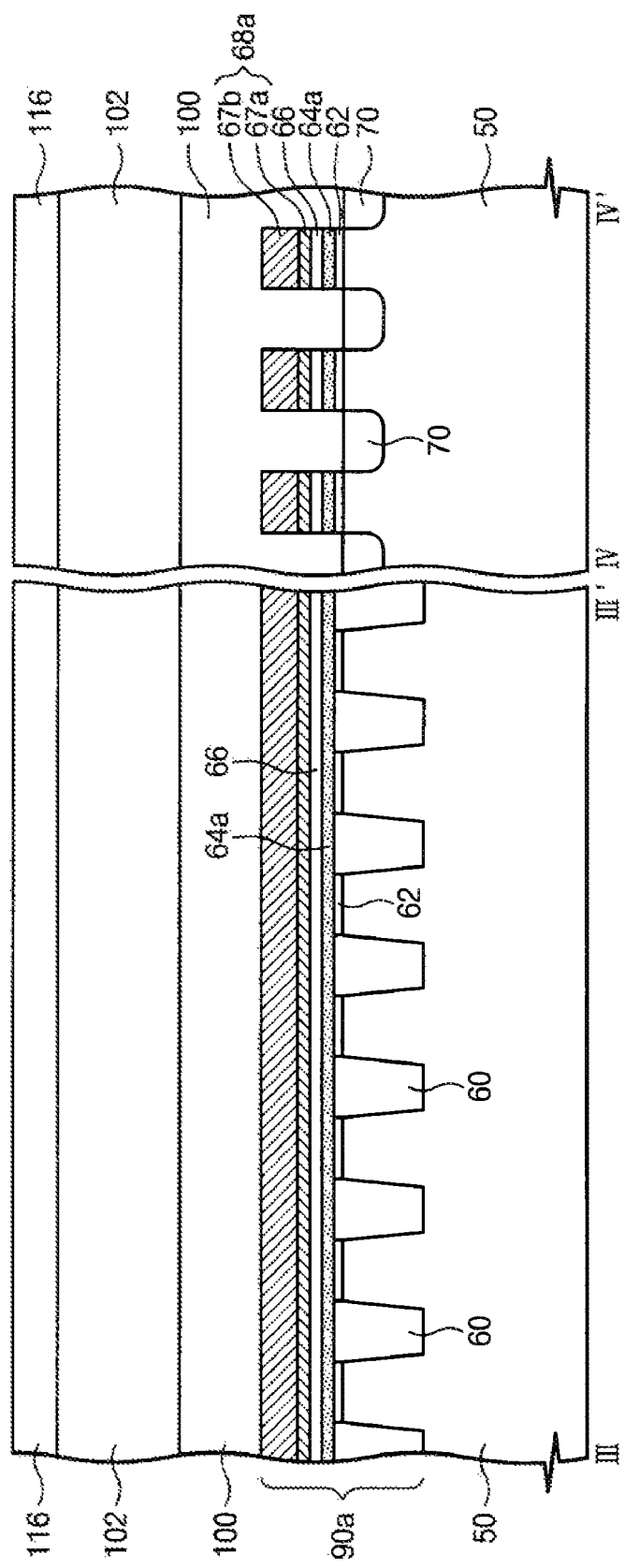

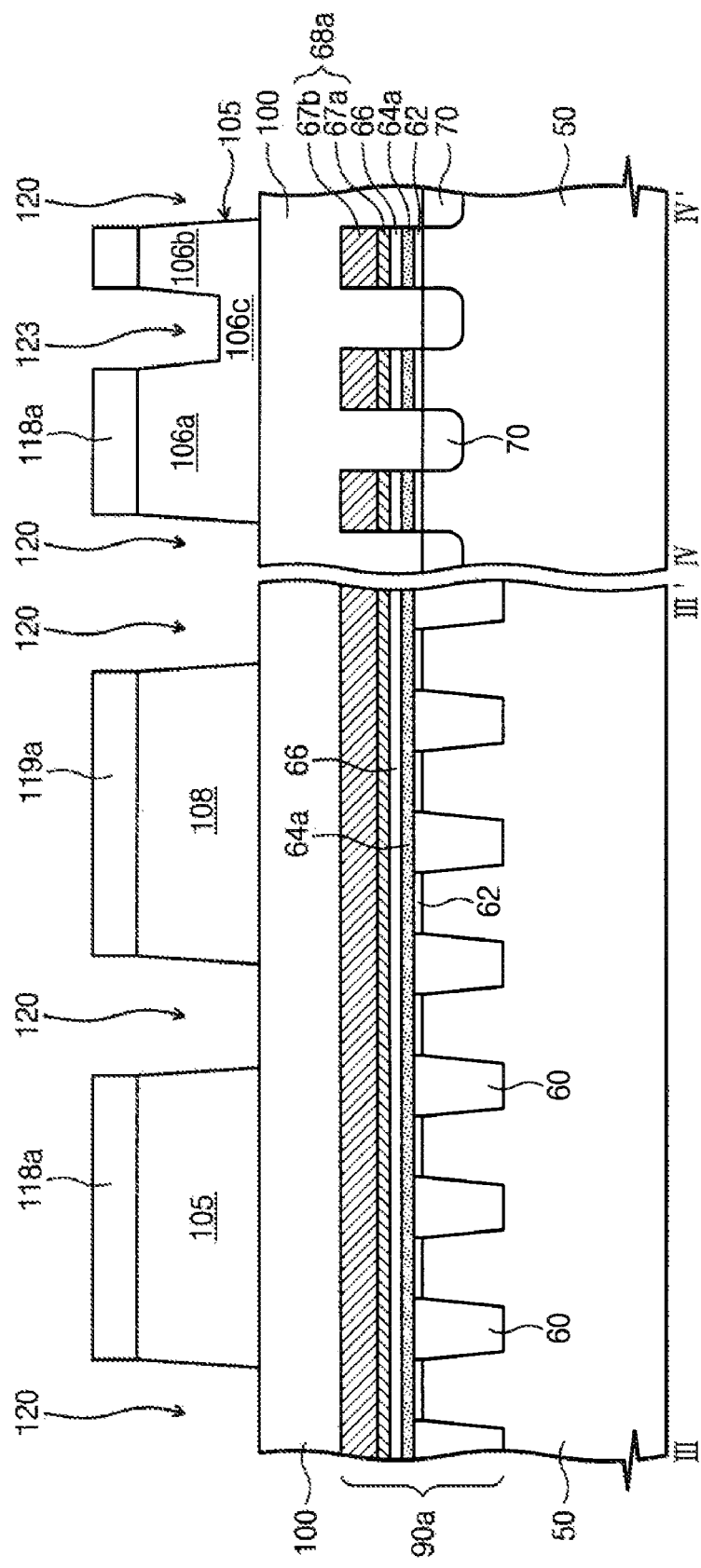

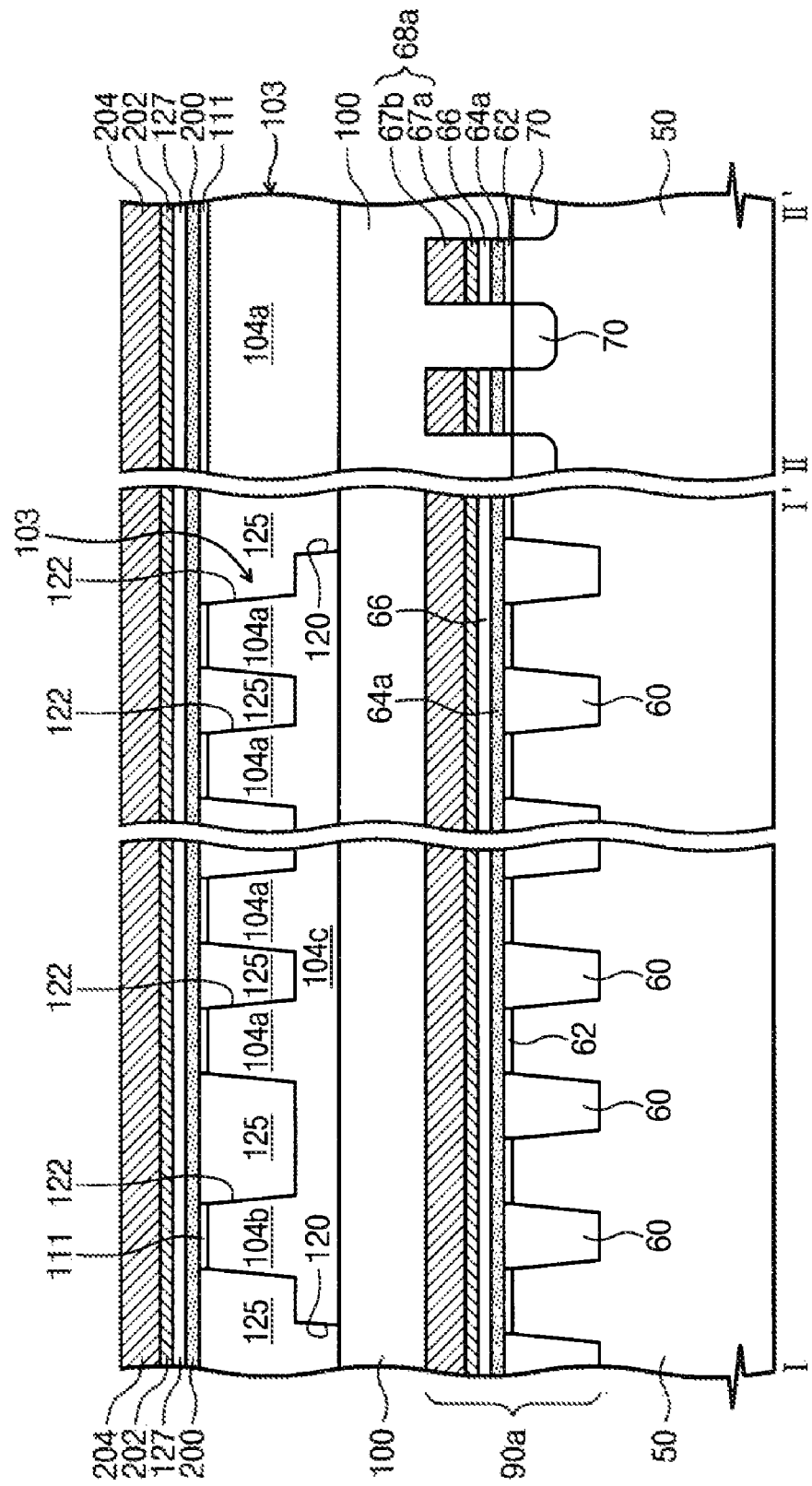

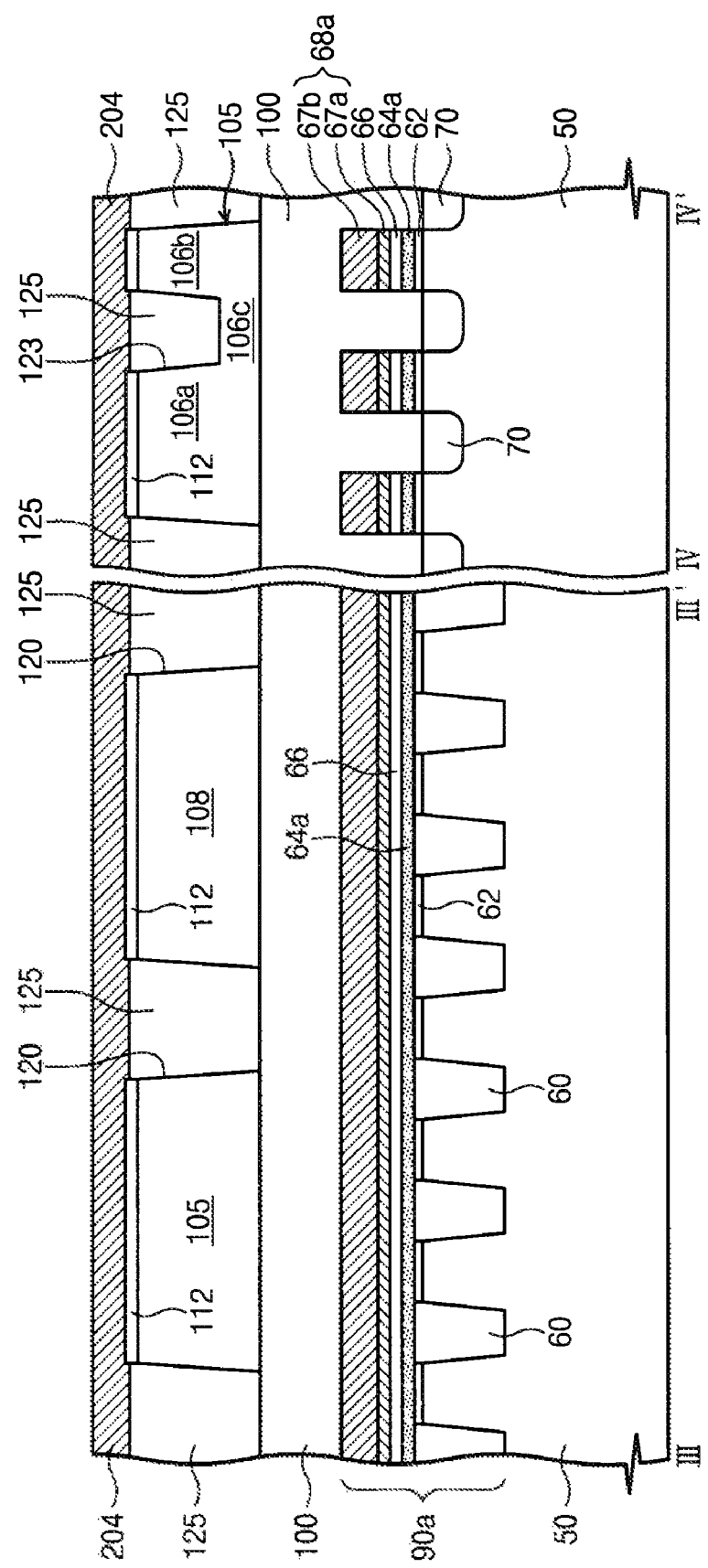

SEMICONDUCTOR DEVICE HAVING DRIVING TRANSISTORS

CROSS-REFERENCE TO RELATED PATENT APPLICATION

This application claims the benefit of foreign priority to Korean Patent Application No. 2008-0049219, filed on May 27, 2008, the disclosure of which is incorporated herein in its entirety by reference.

BACKGROUND

Embodiments of the inventive concepts disclosed herein relate generally to semiconductor devices, and more particularly, to semiconductor device having a plurality of levels of device layers vertically stacked upon one another.

SUMMARY

One embodiment exemplarily described herein can be generally characterized as a semiconductor device that includes a lower level device layer located over a semiconductor substrate, an interlayer insulating film located over the lower level device layer and an upper level device layer located over the interlayer insulating film. The lower level device layer may include a plurality of devices formed in the substrate. The upper level device layer may include a plurality of semiconductor patterns and at least one device formed in each of the plurality of semiconductor patterns. The plurality of semiconductor patterns may be electrically isolated from each other. Each of the plurality of semiconductor patterns may include at least one active portion and at least one body contact portion electrically connected to the at least one active portion.

Another embodiment exemplarily described herein can be generally characterized as a method of forming semiconductor device, wherein the method includes forming a plurality of devices in a substrate to form a lower level device layer over the substrate, forming an interlayer insulating film over the lower level device layer and forming a plurality of semiconductor patterns over the interlayer insulating film. The plurality of semiconductor patterns may include a semiconductor material and the plurality of semiconductor patterns may be electrically isolated from each other. Further, each of the plurality of semiconductor patterns may include at least one active portion and at least one body contact portion electrically connected to the at least one active portion. The method may further include forming at least one device in the at least one active portion of each of the plurality of semiconductor patterns, thereby forming an upper level device layer.

Yet another embodiment exemplarily described herein can be generally characterized as an electronic system that includes at least one input/output device, a memory device configured to store data; a communications interface configured to transmit and/or receive data from an external device; a controller configured to control an operation of at least one of the input/output device, the memory device and the communications interface, and a bus. The controller, the input/output device, the memory device and the communications interface may be communicatively coupled to each other via the bus. At least one of the memory device and the controller are incorporated within a semiconductor device according to any of the embodiments exemplarily described herein.

Yet another embodiment exemplarily described herein can be generally characterized a memory card that includes a memory device configured to store data and a controller configured to control an operation of the semiconductor memory device. At least one of the memory device and the controller are incorporated within a semiconductor device according to any of the embodiments exemplarily described herein.

BRIEF DESCRIPTION OF THE DRAWINGS

The above and other embodiments of the present invention will become more apparent with reference to the attached drawings in which:

FIGS. 2A, 2B, 2C and 2D are cross-sectional views of the semiconductor device shown in FIG. 1, taken along lines I-I', II-II', III-III' and IV-IV' of FIG. 1, respectively, according to one embodiment;

FIGS. 5A, 6A, 7A, 8A and 9A are cross-sectional views taken along line I-I' shown in FIG. 1, illustrating a method of fabricating the semiconductor device shown in FIG. 2A, according to one embodiment;

FIGS. 5B, 6B, 7B, 8B and 9B are cross-sectional views taken along line II-II' shown in FIG. 1, illustrating a method of fabricating the semiconductor device shown in FIG. 2B, according to one embodiment;

FIGS. 5C, 6C, 7C, 8C and 9C are cross-sectional views taken along line III-III' shown in FIG. 1, illustrating a method of fabricating the semiconductor device shown in FIG. 2C, according to one embodiment;

FIGS. 5D, 6D, 7D, 8D and 9D are cross-sectional views taken along line IV-IV' shown in FIG. 1, illustrating a method of fabricating the semiconductor device shown in FIG. 2D, according to one embodiment;

FIGS. 10A, 10B, 10C and 10D are cross-sectional views of the semiconductor device shown in FIG. 1, taken along lines I-I', II-II', III-III' and IV-IV' of FIG. 1, respectively, according to another embodiment;

FIGS. 11A, 12A and 13A are cross-sectional views taken along line I-I' shown in FIG. 1, illustrating a method of fabricating the semiconductor device shown in FIG. 10A, according to one embodiment;

FIGS. 11B, 12B and 13B are cross-sectional views taken along line II-II' shown in FIG. 1, illustrating a method of fabricating the semiconductor device shown in FIG. 10B, according to one embodiment;

FIGS. 11C, 12C and 13C are cross-sectional views taken along line III-III' shown in FIG. 1, illustrating a method of fabricating the semiconductor device shown in FIG. 10C, according to one embodiment;

FIGS. 11D, 12D and 13D are cross-sectional views taken along line IV-IV' shown in FIG. 1, illustrating a method of fabricating the semiconductor device shown in FIG. 10D, according to one embodiment;

DETAILED DESCRIPTION

Figure 1:
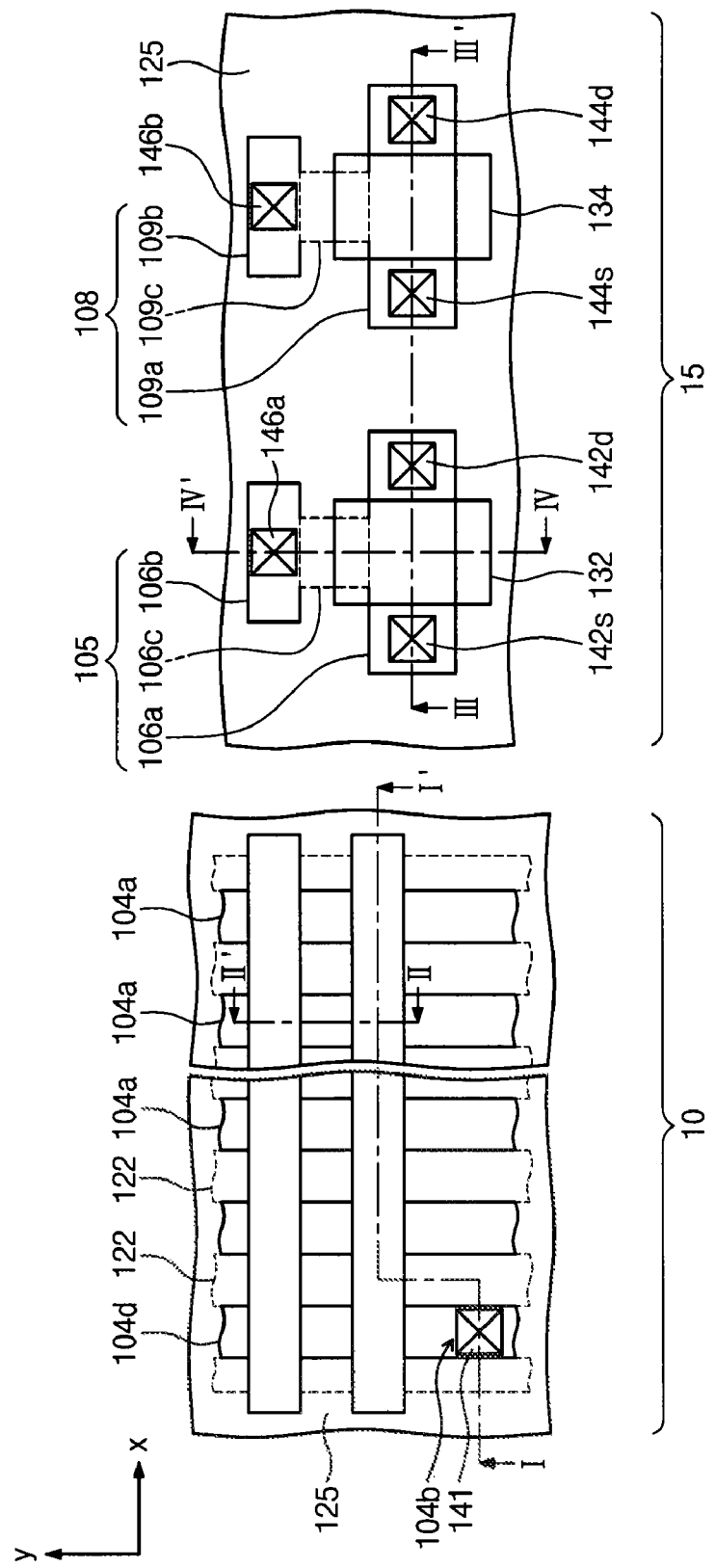
FIG. 1 is a plan view of a semiconductor device according to some embodiments.

Embodiments of inventive concepts will be exemplarily described with reference to the accompanying drawings.

These embodiments may, however, be realized in many different forms and should not be construed as limited to the embodiments set forth herein. Rather, the embodiments are provided so that disclosure of the present invention will be thorough and complete, and will fully convey the scope of the present invention to those skilled in the art. The features of the inventive concepts described herein may be employed in varied and numerous embodiments without departing from the scope of the present invention. In the drawings, the size and relative sizes of layers and regions may be exaggerated for clarity. The drawings are not necessarily to scale. Like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly contacting," "in direct contact with," "directly connected to," "directly coupled to," etc., another element or layer, no intervening elements or layers are present.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees, rotated 180 degrees, or at other orientations) and the spatially relative descriptors used herein may be interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Generally, a semiconductor device according to some embodiments exemplarily described herein can be characterized as including a lower level device layer located over a semiconductor substrate, an interlayer insulating film located over the lower level device layer and an upper level device layer located over the lower interlayer insulating film. The lower level device layer may include a plurality of devices formed in the substrate. The upper level device layer may include a plurality of semiconductor patterns and at least one device formed in each of the plurality of semiconductor patterns. The plurality of semiconductor patterns may be electrically isolated from each other. By electrically isolating the plurality of semiconductor patterns, a highly integrated semiconductor device may be formed. Further, each of the plurality of semiconductor patterns may include at least one active portion and at least one body contact portion electrically connected to the at least one active portion. By providing each of the plurality of semiconductor patterns with at least one active portion and at least one body contact portion, the plurality of semiconductor patterns may be prevented from being placed in an electrically "floating" state, thereby preventing a malfunction of devices formed therein. Exemplary embodiments of the semiconductor device are described below with respect to FIGS. 1, 2A-2D, 3 and 4.

FIG. 1 is a plan view of a semiconductor device according to some embodiments. Specifically, FIG. 1 is a plan view of the upper level device layer of a semiconductor device. FIGS. 2A, 2B, 2C and 2D are cross-sectional views of the semiconductor device shown in FIG. 1, taken along lines I-I', II-II', III-III' and IV-IV' of FIG. 1, respectively, according to one embodiment.

Referring generally to FIGS. 1 and 2A-2D, a semiconductor device may, for example, include a lower level device layer 90 formed over a semiconductor substrate 50, an upper level device layer 92 formed over the lower level device layer 90, and an interlayer insulating film 100 interposed between the lower level device layer 90 and the upper level device layer 92. The semiconductor substrate 50 may be provided as a semiconductor substrate (e.g., a silicon substrate, a germanium substrate, a silicon-germanium substrate, or the like or a combination thereof). In one embodiment, the semiconductor substrate 50 is provided as a bulk semiconductor substrate.

As mentioned above, the lower level device layer 90 may include a plurality of devices formed in the substrate. In one embodiment, each of the plurality of devices included within the lower level device layer 90 may be provided as a memory cell, a driving transistor, a logic device, or the like or a combination thereof. An exemplary embodiment of the lower level device layer 90 is described below with respect to FIGS. 2A-2D.

Referring to FIGS. 2A-2D, the plurality of devices included in the lower level device layer 90 are provided as a plurality of memory cells formed in the semiconductor substrate 50. Each of the plurality of memory cells may, for example, include a lower level control gate pattern 68, a lower level charge storage layer 64, a lower level tunnel insulating film 62, a lower level blocking insulator pattern 66, and a lower level cell source/drain region 70. A device separating pattern 60 may be formed in the semiconductor substrate 50 to define a plurality of substrate active portions extending along a first direction (e.g., the "y" direction). Accordingly, each substrate active portion is part of the semiconductor substrate 50 and the boundaries of each of the plurality of substrate active portions may be delineated by the device separating pattern 60. A plurality of lower level control gate patterns 68 extend over the plurality of substrate active portions along a second direction perpendicular to the first direction (e.g., the "x" direction). Within each memory cell, the lower level charge storage layer 64 is disposed between a lower level control gate pattern 68 and a corresponding one of the plurality of substrate active portions, the lower level tunnel insulating film 62 is disposed between the lower level charge storage layer 64 and a corresponding one of the plurality of substrate active portions, and the lower level blocking insulator pattern 66 is disposed between the lower level control gate pattern 68 and the lower level charge storage layer 64. The lower level cell source/drain region 70 of each of the plurality of memory cells can be formed in the substrate active portion on opposite sides of the lower level control gate pattern 68.

Constructed as described above, each of the plurality of memory cells has a non-volatile characteristic so that data can be retained by a memory cell even when a power supply is discontinued. Because each of the plurality of control gate patterns 68 extends along the second direction, memory cells adjacent to one another along the second direction are connected in series by a common control gate pattern 68 to form a "cell string." Each cell string may have a first end electrically connected to a ground selection transistor (not shown) and a second end electrically connected to a string selection transistor (not shown). Constructed as exemplarily described above, the plurality of memory cells are configured in a NAND-type architecture. In another embodiment, however, the plurality of memory cells may be configured in a NOR-type architecture, as is known in the art.

As mentioned above, the interlayer insulating film is interposed between the lower level device layer 90 and the upper level device layer 92. Referring to FIGS. 2A-2D, the interlayer insulating film is provided as lower interlayer insulating film 100 that covers the lower level device layer 90. The lower interlayer insulating film 100 may include a dielectric material such as an oxide (e.g., silicon oxide), a nitride (e.g., silicon nitride), an oxynitride (e.g., silicon oxynitride), a low-k dielectric material having a dielectric constant less than that of silicon oxide, or the like or a combination thereof.

As mentioned above, the upper level device layer 92 may include a plurality of semiconductor patterns and at least one device formed in each of the plurality of semiconductor patterns. An exemplary discussion of the plurality of semiconductor patterns included in the upper level device layer 92 is provided below with respect to FIGS. 1 and 2A-2D.

Referring to FIG. 1, the upper level device layer 92 may be divided into different device regions, wherein devices formed in one device region are functionally and/or structurally different from devices formed in another device region. As exemplarily described below, devices included within a first upper level device region 10 of the upper level device layer 92 may be provided as memory cells and devices disposed within a second upper level device region 15 of the upper level device layer 92 may be provided as driving transistors. In such an embodiment, the first upper level device region 10 may be referred to herein as a cell array region 10 and the second upper level device region 15 may be referred to herein as a driving circuit device region 15.

The cell array region 10 may include a semiconductor pattern such as a cell semiconductor pattern 103 disposed therein and the driving circuit device region 15 may include a semiconductor pattern such as a first driving semiconductor pattern 105 and a second driving semiconductor pattern 108. The first driving semiconductor pattern 105 and the second driving semiconductor pattern 108 may be disposed substantially parallel to each other. The cell semiconductor pattern 103, the first driving semiconductor pattern 105 and the second driving semiconductor pattern 108 may be disposed on the lower interlayer insulating film 100. In one embodiment, the cell semiconductor pattern 103, the first driving semiconductor pattern 105 and the second driving semiconductor pattern 108 may contact an upper surface of the lower interlayer insulating film 100. The cell semiconductor pattern 103, the first driving semiconductor pattern 105 and the second driving semiconductor pattern 108 may include a semiconductor material having a monocrystalline state. In one embodiment, the semiconductor material may include silicon, germanium, silicon-germanium, or the like or a combination thereof.

The cell semiconductor pattern 103, the first driving semiconductor pattern 105 and the second driving semiconductor pattern 108 may be separated from each other on the lower interlayer insulating film 100 by an isolation trench 120. In one embodiment, the upper surface of the lower interlayer insulating film 100 forms the bottom surface of the isolation trench 120 and side surfaces of the cell semiconductor pattern 103, the first driving semiconductor pattern 105 and the second driving semiconductor pattern 108 form the side surfaces of the isolation trench 120. Thus, the bottom surface of the isolation trench 120 is substantially coplanar with the upper surface of the lower interlayer insulating film 100. Accordingly, the cell semiconductor pattern 103, the first driving semiconductor pattern 105 and the second driving semiconductor pattern 108 may be completely separated from each other by the isolation trench 120. In another embodiment, the isolation trench 120 may extend below the upper surface of the lower interlayer insulating film 100.

As mentioned above, the plurality of semiconductor patterns may be electrically isolated from each other. In one embodiment, the cell semiconductor pattern 103, the first driving semiconductor pattern 105 and the second driving semiconductor pattern 108 may be electrically isolated from each other by the lower interlayer insulating film 100 and a dielectric material interposed between side surfaces of adjacent ones of the cell semiconductor pattern, the first driving semiconductor pattern 105 and the second semiconductor pattern 108. In one embodiment, the dielectric material may be provided as a device separating film 125 disposed within the isolation trench 120. Thus, the cell semiconductor pattern 103, the first driving semiconductor pattern 105 and the second driving semiconductor pattern 108 may be electrically insulated from each other by the device separating film 125. The dielectric material included within the device separating film 125 may include a material such as an oxide (e.g., silicon oxide), a nitride (e.g., silicon nitride), an oxynitride (e.g., silicon oxynitride), a low-κ dielectric material, or the like or a combination thereof, having a dielectric constant less than that of silicon oxide. The dielectric material included in the device separating film 125 may be the same as or different from the dielectric material included in the lower interlayer insulating film 100. In one embodiment, the device separating film 125 may contact the upper surface of the lower interlayer insulating film 100 at the bottom of the isolation trench 120. In the embodiment where the isolation trench 120 extends below the upper surface of the lower interlayer insulating film 100, the device separating film 125 would not be coplanar with the lower surface of the cell semiconductor pattern 103, the first driving semiconductor pattern 105 or the second driving semiconductor pattern 108.

As described above, the first driving semiconductor pattern 105 and the second driving semiconductor pattern 108 are disposed on the lower interlayer insulating film 100, are separated from each other by the isolation trench 120 and are insulated from each other by a dielectric material included within, for example, the device separating film 125. Thus, with reference to FIGS. 1 and 2C, the distance (i.e., a separation distance, Ds) by which the first driving semiconductor pattern 105 is separated from the second driving semiconductor pattern 108 is larger than a thickness (i.e., a critical thickness) at which the dielectric material of the device separating film 125 breaks down in the presence of a high voltage supplied, for example, by a step-up circuit. A first driving transistor may be formed in the first driving semiconductor pattern 105 and a second driving transistor may be formed in the second driving semiconductor pattern 108. One or both of the first driving transistor and the second driving transistor may be provided as a high-voltage driving transistor configured to control a high voltage supplied thereto. In one embodiment, the high voltage may be used to program and/or erase a memory cell and a supply voltage may be used to read a memory cell.

Conventionally, when one or more high voltage transistors are formed on a semiconductor substrate, they can be electrically connected to one another through the semiconductor substrate below the field oxide film. Such electrical connection can be undesirable. Thus, to ensure that adjacent ones of the high voltage transistors are sufficiently insulated from each other, a distance between the adjacent ones of the high voltage transistors must be set to be approximately equal to the channel length of the high voltage transistors. However, because the first driving semiconductor pattern 105 and the second driving semiconductor pattern 108 are disposed on the lower interlayer insulating film 100, are separated from each other by the isolation trench 120 and are insulated from each other by the device separating film 125, the first driving transistor and the second driving transistor may be completely electrically isolated from each other. As a result, a highly integrated semiconductor device can be realized by minimizing the separation distance Ds between the first driving semiconductor pattern 105 and the second driving semiconductor pattern 108. In one embodiment, the separation distance Ds may be in a range of about 15% to about 40% of the channel length (i.e., the distance between the source region and drain region) of the high-voltage driving transistor.

As mentioned above, each of the plurality of semiconductor patterns may include at least one active portion and at least one body contact portion electrically connected to the at least one active portion. In some embodiments, each of the plurality of semiconductor patterns may further include at least one recess region formed between the at least one active portion and the at least one body contact potion. In such embodiments, each of the plurality of semiconductor patterns also includes at least one connector portion disposed under the at least one recess region. The at least one connector portion can electrically connect the at least one active portion and the at least one body contact portion to each other. An exemplary discussion of the at least one active portion, the at least one body contact portion and the least one connector portion, as included within the cell semiconductor pattern 103, is provided below with respect to FIGS. 1 and 2A and 2B.

Figures 2A, 2B:
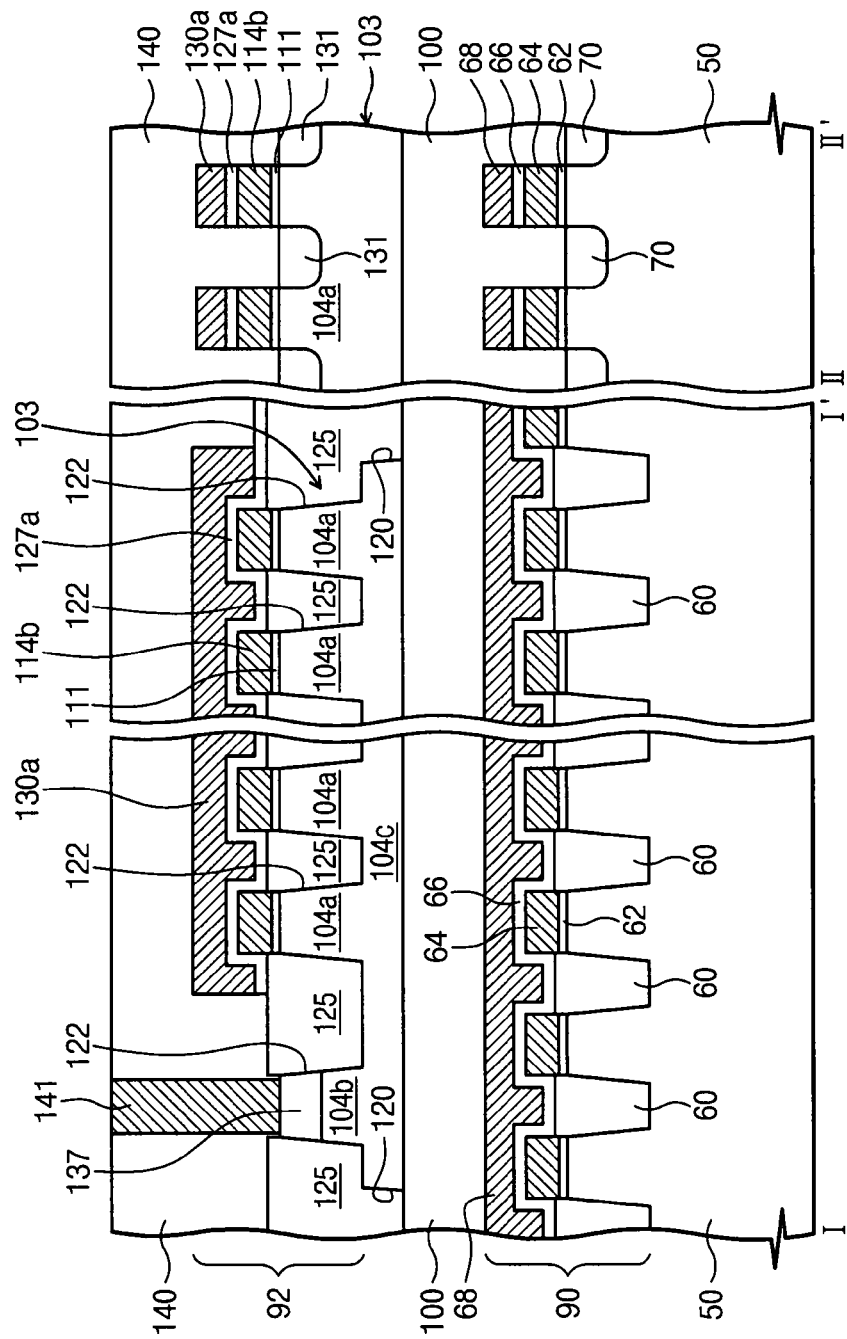

Referring to FIGS. 1, 2A and 2B, the cell semiconductor pattern 103 may include a plurality of cell active portions 104a and a cell body contact portion 104b electrically connected to the plurality of cell active portions 104a. The cell semiconductor pattern 103 may further include a plurality of cell recess regions 122 formed between the plurality of cell active portions 104a and between one of the plurality of cell active portions 104a and the cell body contact potion 104b. Accordingly, the cell semiconductor pattern 103 may also include a cell connector portion 104c disposed under the plurality of cell recess regions 122. The cell connector portion 104c can electrically connect the plurality of cell active portions 104a and the cell body contact portion 104b to each other. A dielectric material may be disposed within each of the plurality of cell recess regions 122. In one embodiment, the device separating film 125 is disposed within each of the plurality of cell recess regions 122.

In one embodiment, the depth of the plurality of cell recess regions 122 is less than the thickness of the cell semiconductor pattern 103. Accordingly, the plurality of cell recess regions 122 may define a plurality of cell active portions 104a, a cell body contact portion 104b, a cell connector portion 104c and a dummy cell active portion 104d. As a result, side surfaces of the plurality of plurality of cell active portions 104a, the cell body contact portion 104b and the dummy cell active portion 104d form sidewalls of the plurality of cell recess regions 122 and the upper surface of the cell connector portion 104c forms bottom surfaces of the plurality of cell recess regions 122. In the illustrated embodiment, the cell body contact portion 104b is formed as part of the dummy cell active portion 104d. In another embodiment, however, the cell body contact portion 104b and the dummy cell active portion 104d may be separated from each other by one or more cell recess regions 122.

The bottom surface of each of the plurality of cell recess regions 122 is disposed above the upper surface of the lower interlayer insulating film 100 such that a portion (i.e., the cell connector portion 104c) of the cell semiconductor pattern 103 forms the bottom surface of each of the plurality of cell recess regions 122. Accordingly, the plurality of cell active portions 104a may be electrically connected to each other via the cell connector portion 104c of the cell semiconductor pattern 103, which is disposed under the plurality of cell recess regions 122. In one embodiment, the bottom surfaces of each of the plurality of cell recess regions 122 are substantially the coplanar.

The plurality of cell active portions 104a can be arranged to extend along the first direction. The dummy cell active portion 104d can be arranged to extend substantially parallel to the plurality of cell active portions 104a. In the illustrated embodiment, the dummy cell active portion 104d is disposed adjacent to one of the plurality of cell active portions 104a of the cell semiconductor pattern 103. In another embodiment, the dummy cell active portion 104d is disposed adjacent to a plurality of cell active portions 104a of the cell semiconductor pattern 103.

An exemplary discussion of the at least one active portion, the at least one body contact portion and the least one connector portion, as included within the first driving semiconductor pattern 105 and second driving semiconductor pattern 108, is provided below with respect to FIGS. 1 and 2C and 2D.

Referring to FIGS. 1, 2C and 2D, the first driving semiconductor pattern 105 may include a first driving active portion 106a and a first driving body contact portion 106b electrically connected to the first driving active portion 106a. The first driving semiconductor pattern 105 may further include a first driving recess region 123 formed between the first driving active portion 106a and the first driving body contact potion 106b. Accordingly, the first driving semiconductor pattern 105 may also include a first driving connector portion 106c disposed under the first driving recess region 123. The first driving connector portion 106c can electrically connect the first driving active portion 106a and the first driving body contact portion 106b to each other.

As exemplarily shown, the first driving active portion 106a and the first driving body contact portion 106b may be may be laterally spaced apart from each other and the first driving connector portion 106c may be disposed between the first driving active portion 106a and the first driving body contact portion 106b. Accordingly, the first driving active portion 106a and the first driving body contact portion 106b may be electrically connected together by the first driving connector portion 106c.

An upper surface of the first driving active portion 106a and an upper surface of the first driving body contact portion 106b may be substantially the same height. That is, the upper surfaces of the first driving active portion 106a and the first driving body contact portion 106b may be substantially coplanar. The upper surface of the first driving connector portion 106c is lower than the upper surfaces of the first driving active portion 106a and the first driving body contact portion 106b. In one embodiment, the upper surface of the first driving connector portion 106c is substantially coplanar with the upper surface of the cell connector portion 104c. A first end of the first driving connector portion 106c is connected to the first driving active portion 106a and a second end of the first driving connector portion 106c is connected to the first driving body contact portion 106b. Accordingly, the first driving semiconductor pattern 105 may include a first driving recess region 123 formed therein, wherein the depth of the first driving recess region 123 is less than the thickness of the first driving semiconductor pattern 105 and wherein the first driving recess region 123 defines the first driving active portion 106a, the first driving body contact portion 106b and the first driving connector portion 106c. As a result, side surfaces of the first driving active portion 106a and the first driving body contact portion 106b form side surfaces of the first driving recess region 123 and the upper surface of the first driving connector portion 106c forms the bottom surface of the first driving recess region 123. Thus, an upper portion of the first driving active portion 106a and an upper portion of the first driving body contact portion 106b are separated from each other by the first driving recess region 123 while a lower portion of the first driving active portion 106a and a lower portion of the first driving body contact portion 106b are connected to each other via the first driving connector portion 106c.

A dielectric material may be disposed within the first driving recess region 123. In one embodiment, the device separating film 125 is disposed within the first driving recess region 123. In another embodiment, the device separating film 125 may fill the first driving recess region 123.

Referring to FIGS. 1 and 2C, the second driving semiconductor pattern 108 may include a second driving active portion 109a and a second driving body contact portion 109b electrically connected to the second driving active portion 109a. The second driving semiconductor pattern 108 may further include a second driving recess region (not shown) formed between the second driving active portion 109a and the second driving body contact potion 109b. Accordingly, the second driving semiconductor pattern 108 may also include a second driving connector portion 109c disposed under the second driving recess region. The second driving connector portion 109c can electrically connect the second driving active portion 109a and the second driving body contact portion 109b to each other.

As exemplarily shown, the second driving active portion 109a and the second driving body contact portion 109b may be may be laterally spaced apart from each other and the second driving connector portion 109c may be disposed between the second driving active portion 109a and the second driving body contact portion 109b. Accordingly, the second driving active portion 109a and the second driving body contact portion 109b may be electrically connected together by the second driving connector portion 109c.

An upper surface of the second driving active portion 109a and an upper surface of the second driving body contact portion 109b may be substantially the same height. That is, the upper surfaces of the second driving active portion 109a and the second driving body contact portion 109b may be substantially coplanar. The upper surface of the second driving connector portion 109c is lower than the upper surfaces of the second driving active portion 109a and the second driving body contact portion 109b. In one embodiment, the upper surface of the second driving connector portion 109c is substantially coplanar with the upper surface of the cell connector portion 104c. In another embodiment, the upper surface of the second driving connector portion 109c is substantially coplanar with the upper surface of the first driving connector portion 106c. A first end of the second driving connector portion 109c is connected to the second driving active portion 109a and a second end of the second driving connector portion 109c is connected to the second driving body contact portion 109b. Accordingly, the second driving semiconductor pattern 108 may include a second driving recess region (not shown) formed therein, wherein the depth of the second driving recess region is less than the thickness of the second driving semiconductor pattern 108 and wherein the second driving recess region defines the second driving active portion 109a, the second driving body contact portion 109b and the second driving connector portion 109c. As a result, side surfaces of the second driving active portion 109a and the second driving body contact portion 109b form side surfaces of the second driving recess region and the upper surface of the second driving connector portion 109c forms the bottom surface of the second driving recess region. Thus, an upper portion of the second driving active portion 109a and an upper portion of the second driving body contact portion 109b are separated from each other by the second driving recess region while a lower portion of the second driving active portion 109a and a lower portion of the second driving body contact portion 109b are connected to each other via the second driving connector portion 109c.

A dielectric material may be disposed within the second driving recess region. In one embodiment, the device separating film 125 is disposed within the second driving recess region. In another embodiment, the device separating film 125 may fill the second driving recess region.

In some embodiments, each of the plurality of semiconductor patterns may have a planar configuration in which the at least one active portion, the at least one body contact portion and the at least one connector portion thereof are disposed sequentially along a first direction. Further, a length of the at least one connector portion along another direction perpendicular to the one direction is less than or substantially equal to a length of at least one of the at least one body contact portion and the at least active portion along the other direction. Moreover, a length of the at least one body contact portion along the second direction is less than or substantially equal to a length of the at least one active portion along the second direction. An exemplary discussion of the planar configuration of the first driving semiconductor pattern 105 and the second driving semiconductor pattern 108 is provided below with respect to FIG. 1.

Referring to FIG. 1, the first driving semiconductor pattern 105 may have a planar configuration in which the first driving active portion 106a, the first driving connector portion 106c and first driving body contact portion 106b are disposed sequentially along the first direction parallel to a top surface of the semiconductor substrate 50. The length of the first driving connector portion 106c along the second direction, parallel to the top surface of the semiconductor substrate 50 and perpendicular to the first direction, is less than the length of the first driving active portion 106a and the first driving body contact portion 106b along the second direction. In addition, the length of the first driving body contact portion 106b along the second direction is less than the length of the first driving active portion 106a. Although the first driving semiconductor pattern 105 is exemplarily illustrated as having a planar configuration in which the first driving active portion 106a, the first driving connector portion 106c and first driving body contact portion 106b are disposed sequentially along the first direction, it will be appreciated that the first driving active portion 106a, the first driving connector portion 106c and first driving body contact portion 106b may be disposed sequentially along any direction parallel to the top surface of the semiconductor substrate 50.

Referring still to FIG. 1, the second driving semiconductor pattern 108 may have a planar configuration in which the second driving active portion 109a, the second driving connector portion 109c and second driving body contact portion 109b may be disposed sequentially along the first direction. The length of the second driving connector portion 109c along the second direction may be less than the length of the second driving active portion 109a and the second driving body contact portion 109b along the second direction. Although the second driving semiconductor pattern 108 is exemplarily illustrated as having a planar configuration in which the second driving active portion 109a, the second driving connector portion 109c and second driving body contact portion 109b are disposed sequentially along the first direction, it will be appreciated that the second driving active portion 109a, the second driving connector portion 109c and second driving body contact portion 109b may be disposed sequentially along any direction parallel to the top surface of the semiconductor substrate 50.

As exemplarily discussed above, the planar configuration of the second driving semiconductor pattern 108 is the same as the planar configuration of the first driving semiconductor pattern 105. It will be appreciated, however, that the planar configuration of the second driving semiconductor pattern 108 may be different from the planar configuration of the first driving semiconductor pattern 105.

As mentioned above, the upper level device layer 92 may include at least one device formed in each of the plurality of semiconductor patterns. Generally, each of the plurality of devices included within the upper level device layer 92 may be provided as a memory cell, a driving transistor, a logic device, or the like or a combination thereof. In one embodiment, and as exemplarily described above, devices included within the cell device region 10 may be provided as memory cells and devices disposed within the driving circuit device region 15 may be provided as driving transistors. An exemplary discussion of the plurality of devices formed in the plurality of semiconductor patterns included in the upper level device layer 92 is provided below with respect to FIGS. 1 and 2A-2D.

In one embodiment, the plurality of devices included in the upper level device layer 92 include at least one memory cell having a charge storage pattern. For example, and with reference to FIGS. 1, 2A and 2B, a plurality of control gate patterns 130a may be arranged to extend along the aforementioned second direction over the plurality of cell active portions 104a and the dummy cell active portion 104d. A memory cell may be formed at each location where one of the plurality of control gate patterns 130a crosses over one of the plurality of cell active portions 104a.

In one embodiment, each memory cell comprises a charge storage pattern such as a floating gate pattern 114b disposed between a control gate pattern 130a and a cell active portion 104a, a tunnel insulating film 111 disposed between the floating gate pattern 114b and the cell active portion 104a, a blocking insulator pattern 127a disposed between the floating gate pattern 114b and the control gate pattern 130a, and a cell source/drain region 131 formed within the cell active portion 104a on opposite sides of the control gate pattern 130a. The floating gate pattern 114b of a memory cell may be separated from the floating gate pattern 114b of an adjacent memory cell along the first direction and along the second direction. The floating gate pattern 114b serves as a charge storage layer of a memory cell and is capable of holding electric charges. In one embodiment, the floating gate pattern 114b includes a semiconductor material. In one embodiment, the control gate pattern 130a includes a conductive material such as a doped semiconductor, a metal (e.g. tungsten, molybdenum, or the like), a conductive metal nitride (e.g. titanium nitride, tantalum nitride, or the like), a metal silicide, or the like or a combination thereof. In one embodiment, the tunnel insulating film 111 may include an oxide. In one embodiment, the blocking insulator pattern 127a may include an oxide (e.g., silicon oxide), an oxide-nitride-oxide (ONO) (e.g., silicon oxide-silicon nitride-silicon oxide), a high-κ dielectric material (e.g., an insulating metal oxides such as aluminum oxide, hafnium oxide, or the like) having a dielectric constant greater than that of the tunnel insulating film 111, or the like or a combination thereof. In one embodiment, the blocking insulator pattern 127a consists of oxides only and is thicker than the tunnel insulating film 111.

Each of the plurality of memory cells may have a non-volatile characteristic. As a result, data can be retained by a memory cell even when a power supply is discontinued. Because each of the plurality of control gate patterns 130a extends along the second direction, memory cells adjacent to one another along the second direction are connected in series by a common control gate pattern 130a to form a "cell string." Each cell string may have a first end electrically connected to a ground selection transistor (not shown) and a second end electrically connected to a string selection transistor (not shown). Constructed as exemplarily described above, the plurality of memory cells are configured in a NAND-type architecture. In another embodiment, however, the plurality of memory cells may be configured in a NOR-type architecture, as is known in the art.

The plurality of cell active portions 104a, the cell body contact portion 104b and the cell connector portion 104c of the cell semiconductor pattern 103 may have the same conductivity type (e.g., the plurality of cell active portions 104a, the cell body contact portion 104b and the cell connector portion 104c of the cell semiconductor pattern 103 may be doped with dopant having the same conductivity type). Thus, each of the plurality of cell active portions 104a may be electrically connected to the same cell body contact portion 104b via the cell connector portion 104c of the cell semiconductor pattern 103. A cell body contact doped region 137 can be formed in an upper portion of the cell body contact portion 104b. In one embodiment, the cell body contact doped region 137 and the cell pickup region 104b may have the same conductivity type. In another embodiment, a concentration of dopant having a conductivity type in the cell body contact doped region 137 may be higher than a concentration of dopant having the conductivity type in the cell pickup region 104b.

As exemplarily described above, the cell semiconductor pattern 103 includes the cell active portions 104a where the cell source/drain regions 131 are formed. In some embodiments, the cell source/drain regions 131 receive a voltage lower than a high voltage. The cell body contact portion 104b may receive a back bias voltage, which is then supplied to a plurality of memory cells via the cell connector portion 104c of the cell semiconductor pattern 103, which is connected to the cell active portions 104a and the cell body contact portion 104b. With this arrangement, a back bias voltage can be supplied to the cell active portions 104a, which is disposed under corresponding ones of the floating gates 114b. As a result, a highly integrated and highly reliable semiconductor device can be realized.

As exemplarily described above, each of the plurality of cell active portions 104a can be connected to the same cell body contact portion 104b. Accordingly, a back bias voltage can be supplied to each of the plurality of memory cells through a single cell body contact portion 104b. In another embodiment, however, a plurality of cell body contact portions 104b may be provided. In such an embodiment, different groups of the plurality of cell active portions 104a can be connected to different ones of the plurality of cell body contact portions 104b. In such an embodiment, a plurality of cell connector portions 104c may be provided to electrically connect the plurality of cell body contact portions 104b to the plurality of active cell portions 104a. It will be appreciated, however, that the number of cell body contact portions 104b included in the cell semiconductor pattern 103 will be less than the number of cell active portions 104a included in the cell semiconductor pattern 103.

In one embodiment, the plurality of devices included in the upper level device layer 92 may include a first driving transistor. For example, and with reference to FIGS. 1, 2C and 2D the first driving transistor may be formed in the upper portion of the first driving active portion 106a. The first driving transistor may include a first driving gate pattern 132 disposed on the upper portion of the first driving active portion 106a, as well as a first driving source region 133s and a first driving drain region 133d disposed within the upper portion of the first driving active portion 106a. Thus, a channel region of the first driving transistor may be formed within the upper portion of the first driving active portion 106a, between the first driving source region 133s and a first driving drain region 133d and under the first driving gate pattern 132.

The first driving gate pattern 132 may include a first driving lower gate pattern 115a' and a first driving upper gate pattern 130b disposed on the first driving lower gate pattern 115a'. In one embodiment, a first driving inter-gate pattern 127b having a first driving opening 128a defined therein may be disposed between the first driving lower gate pattern 115a' and first driving upper gate pattern 130b. The first driving lower gate pattern 115a' and first driving upper gate pattern 130b may directly contact each other through the first driving opening 128a. For example, a portion of the first driving upper gate pattern 130b may be within the first driving opening 128a to directly contact the first driving lower gate pattern 115a'. In one embodiment, the first driving upper gate pattern 130b may fill the first driving opening 128a.

In one embodiment, the first driving lower gate pattern 115a' may include the same material as the floating gate pattern 114b. In one embodiment, the first driving upper gate pattern 130b may be made of substantially the same material as the control gate pattern 130a. In one embodiment, the first driving inter-gate pattern 127b may be made of the same material as the blocking insulator pattern 127a.

The first driving active portion 106a, the first driving connector portion 106c and the first driving body contact portion 106b may have a first conductivity type. For example, the first driving active portion 106a, the first driving connector portion 106c and the first driving body contact portion 106b may be doped with a dopant having the first conductivity type. Thus, the first driving active portion 106a and the channel region of the first driving transistor may be electrically connected to the first driving body contact portion 106b via the first driving connector portion 106c. In one embodiment, the first driving active portion 106a, the first driving connector portion 106c and the first driving body contact portion 106b may have substantially the same concentration of the dopant having the first conductivity type. The first driving source region 133s and the first driving drain region 133d may have a second conductivity type opposite to the first conductivity type. Accordingly, the first driving source region 133s and the first driving drain region 133d may be doped with a dopant having the second conductivity.

A first driving body contact doped region 138 may be formed in an upper portion of the first driving body contact portion 106b. In one embodiment, the first driving body contact doped region 138 has the first conductivity type and is doped with dopant having the first conductivity type. In another embodiment, a concentration of dopant having the first conductivity type in the first driving body contact doped region 138 may be greater than a concentration of dopant having the first conductivity type in the first driving pickup region 106b.

If the first driving active portion 106a is placed in an electrically "floating" state, then leak charges can accumulate at the first driving active portion 106a when the first driving transistor is actuated repeatedly. As a result, the electric potential at the first driving active portion 106a fluctuates as leak charges accumulate at the first driving active portion 106a, which can cause a malfunction of the first driving transistor. Because the first driving active portion 106a is electrically connected to the first driving body contact portion 106b via the first driving connector portion 106c, however, a back bias voltage can be applied to the first driving body contact portion 106b and be transmitted to the first driving active portion 106a and the channel region of the first driving transistor via the first driving connector portion 106c. As a result, the first driving transistor can be prevented from experiencing a floating body effect and a highly reliable semiconductor device can be realized.

In one embodiment, the plurality of devices included in the upper level device layer 92 may include a second driving transistor. For example, and with reference to FIGS. 1 and 2C, the second driving transistor may be formed in the upper portion of the second driving active portion 109a. The second driving transistor may include a second driving gate pattern 134 disposed on the upper portion of the first driving active portion 109a, as well as a second driving source region 135s and a second driving drain region 135d disposed within the upper portion of the second driving active portion 109a. Thus, a channel region of the second driving transistor may be formed within the upper portion of the second driving active portion 109a, between the second driving source region 135s and a second driving drain region 135d and under the second driving gate pattern 134.

The second driving gate pattern 134 may include a second driving lower gate pattern 115b' and a second driving upper gate pattern 130c disposed on the second driving lower gate pattern 115b'. In one embodiment, a second driving inter-gate pattern 127c having a second driving opening 128b defined therein may be disposed between the second driving lower gate pattern 115b' and second driving upper gate pattern 130c. The second driving lower gate pattern 115b' and second driving upper gate pattern 130c may directly contact each other through the second driving opening 127c. For example, a portion of the second driving upper gate pattern 130c may be within the second driving opening 128b to directly contact the second driving lower gate pattern 115b'. In one embodiment, the second driving upper gate pattern 130c may fill the second driving opening 128b.

In one embodiment, the second driving lower gate pattern 115b' may include the same material as the floating gate pattern 114b and the first driving lower gate pattern 115a'. In one embodiment, the second driving upper gate pattern 130c may be made of substantially the same material as the control gate pattern 130a and the first driving upper gate pattern 130b. In one embodiment, the second driving inter-gate pattern 127c may be made of the same material as the blocking insulator pattern 127a and the first driving inter-gate pattern 127b.

The second driving active portion 109a, the second driving connector portion 109c and the second driving body contact portion 109b may have the first conductivity type. For example, the second driving active portion 109a, the second driving connector portion 109c and the second driving body contact portion 109b may be doped with a dopant having the first conductivity type. Thus, the second driving active portion 109a and the channel region of the second driving transistor may be electrically connected to the second driving body contact portion 109b via the second driving connector portion 109c. In one embodiment, the second driving active portion 109a, the second driving connector portion 109c and the second driving body contact portion 109b may have substantially the same concentration of the dopant having the first conductivity type. The second driving source region 135s and the second driving drain region 135d may have the second conductivity type opposite to the first conductivity type. Accordingly, the second driving source region 135s and the second driving drain region 135d may be doped with a dopant having the second conductivity.

A second driving body contact doped region (not shown) similar to the first driving body contact doped region 138 may be formed in an upper portion of the second driving body contact portion 109b. In one embodiment, the second driving body contact doped region has the first conductivity type and is doped with dopant having the first conductivity type. In another embodiment, a concentration of dopant having the first conductivity type in the second driving body contact doped region may be greater than a concentration of dopant having the first conductivity type in the second driving pickup region 109b.

Because the second driving active portion 109a is electrically connected to the second driving body contact portion 109b via the second driving connector portion 109c, a back bias voltage can be applied to the second driving body contact portion 109b and be transmitted to the second driving active portion 109a and the channel region of the second driving transistor via the second driving connector portion 109c. As a result, the second driving transistor can be prevented from experiencing a floating body effect and a highly reliable semiconductor device can be realized.

In one embodiment, the separation distance Ds between the first driving semiconductor pattern 105 and the second driving semiconductor pattern 108 may correspond to the minimum distance possible between the first driving transistor and the second driving transistor (e.g., the minimum distance possible between the first driving drain region 133d and the second driving source region 135s).

The first driving transistor and the second driving transistor may each include a driving gate insulating film 112. Within the first driving transistor, the driving gate insulating film 112 is disposed between the first driving gate pattern 132 and the first driving semiconductor pattern 105. Similarly within the second driving transistor, the driving gate insulating film 112 is disposed between the second driving gate pattern 134 and the second driving semiconductor pattern 108. As exemplarily illustrated, the thickness of the driving gate insulating film 112 within the first driving transistor is substantially the same as a thickness of the driving gate insulating film 112 within the second driving transistor. As a result, the first driving transistor and the second driving transistor may control a voltage higher than a voltage of a power supply (i.e., a "high voltage") generated by a step-up circuit. Accordingly, the first driving transistor and the second driving transistor may each be considered a "high voltage driving transistor." In other embodiments, however, the first driving transistor may control the high voltage and the second driving transistor may control a voltage (i.e., a low voltage) lower than the high voltage, or vice-versa. Accordingly, one of the first driving transistor and the second driving transistor may each be considered a "high voltage driving transistor" and the other of the first driving transistor and the second driving transistor may each be considered a "low voltage driving transistor." In such embodiments, a thickness of the driving gate insulating film 112 in the high voltage driving transistor is greater than a thickness of the driving gate insulating film 112 in the low voltage driving transistor.

Referring to FIGS. 1, 2A and 2B, an upper interlayer insulating film 140 covers the plurality of memory cells formed in the cell semiconductor pattern 103 and a cell pickup plug 141 extends through the upper interlayer insulating film 140 to be electrically connected to the cell body contact portion 104b. In one embodiment, the cell pickup plug 141 may directly contact the cell body contact doped region 137 to be electrically connected to the cell body contact portion 104b.

Referring to FIGS. 1, 2C and 2D, an upper interlayer insulating film 140 covers the first driving transistor formed in the first driving semiconductor pattern 105 and the second driving transistor formed in the second driving semiconductor pattern 108. A first source plug 142s and a first drain plug 142d extends through the upper interlayer insulating film 140 and is electrically connected to the first driving source region 133s and the first driving drain region 133d, respectively, of the first transistor. A first driving pickup plug 146a extends through the upper interlayer insulating film 140 and is electrically connected to the first driving body contact portion 104b. In one embodiment, the first driving pickup plug 146a may directly contact the first driving body contact doped region 138 to be electrically connected to the first driving body contact portion 106b. A second source plug 144s and a second drain plug 144d extends through the upper interlayer insulating film 140 and is electrically connected to the second driving source region 135s and the second driving drain region 135d, respectively, of the second transistor. A second driving pickup plug 146b extends through the upper interlayer insulating film 140 and is electrically connected to the second driving body contact portion 109b. In one embodiment, the second driving pickup plug 146b may directly contact the second driving body contact doped region to be electrically connected to the second driving body contact portion 109b.

Although not illustrated, interconnect patterns may be formed on the upper interlayer insulating film 140 to be electrically connected to the cell pickup plug 141, the first source plug 142s, the first drain plug 142d, the second source plug 144s, the second drain plug 144d, the first driving pickup plug 146a and the second driving pickup plug 146b. Although not illustrated, contact plugs may also extend through the upper interlayer insulating film 140 and be electrically connected to impurity regions adjacent to the ground selection transistor and string selection transistor associated with each cell string in the upper level device layer 92. The interconnect patterns formed on the upper interlayer insulating film 140 may also electrically contact these contact plugs.

Although not illustrated, contact holes may extend through the upper interlayer insulating film 140, the device separating film 125 and the lower interlayer insulating film 100 and contact plugs may be formed within the contact holes to electrically connect devices formed in the lower level device layer 90 to the interconnect patterns. Contact plugs may also extend through the upper interlayer insulating film 140, the device separating film 125 and the lower interlayer insulating film 100 and be electrically connected to impurity regions adjacent to the ground selection transistor and string selection transistor associated with each cell string in the lower level device layer 90. The interconnect patterns formed on the upper interlayer insulating film 140 may also electrically contact these contact plugs.

Although the semiconductor device has been exemplarily described with respect to FIGS. 1 and 2A-2D as including a lower level device layer 90 and an upper level device layer 92 separated from each other by the lower interlayer insulating film 100, it will be appreciated that one or more additional device layers may be disposed between the lower interlayer insulating layer 100 the upper level device layer 92, disposed over the upper level device layer 92, or a combination thereof. In such embodiments, the one or more additional device layers may include a plurality of semiconductor patterns and at least one device formed in each of the plurality of semiconductor patterns. It will be appreciated that the one or more additional device layers and the upper level device layer may be separated from each other by one or more corresponding interlayer insulating films, similar to the lower interlayer insulating film 100.

The plurality of semiconductor patterns in each of the one or more additional device layers may be provided in a similar manner as discussed above with respect to the cell semiconductor pattern 103, the first driving semiconductor pattern 105 and/or the second driving semiconductor pattern 108. The at least one device formed in each of the plurality of semiconductor patterns may be provided in a similar manner as discussed above with respect to the devices included in the upper level device layer 92. For example, each of the plurality of devices included within the one or more additional device layers may be provided as a memory cell, a driving transistor, a logic device, or the like or a combination thereof.

In view of the above, it will be appreciated that the semiconductor device described above with respect to FIGS. 1 and 2A-2D may be provided as a memory device, a logic device, or hybrid memory/logic device having a plurality of device layers, wherein each device layer includes one or more memory cells, one or more driving transistors, one or more logic circuits, or the like or a combination thereof. In some embodiments, the one or more memory cells, one or more driving transistors and the one or more logic circuits (or the like) associated one or more device layers may be electrically connected together in any desired manner via one or more of the aforementioned interconnection patterns, plugs, or the like or a combination thereof.

Figure 3:
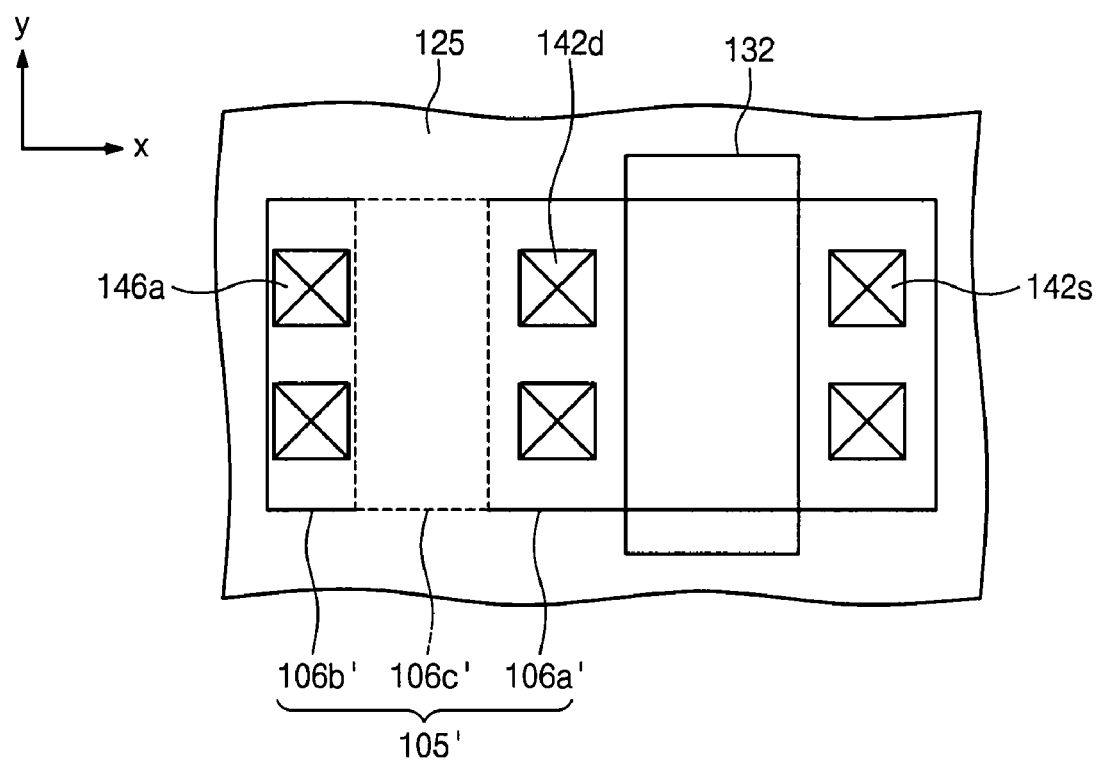
FIG. 3 is a plan view illustrating a planar configuration of the first driving semiconductor pattern, according to another embodiment.

FIG. 3 is a plan view illustrating a planar configuration of the first driving semiconductor pattern in the semiconductor device shown in FIG. 1, according to another embodiment.

Referring to FIG. 3, the first driving semiconductor pattern 105 described above with respect to FIG. 1 may have a planar configuration corresponding to the first driving semiconductor pattern 105'. As shown in FIG. 3, the first driving semiconductor pattern 105' may include a first driving active portion 106a', a first driving connector portion 106c' and the first driving body contact portion 106b' may be substantially the same along the first direction (e.g., the "y" direction). The first driving gate pattern 132 may extend over said first driving active portion 106a' along the first direction. Other than the planar configuration exemplarily described above, the first driving semiconductor pattern 105' is the same as the first driving semiconductor pattern 105 discussed above with respect to FIGS. 1, 2C and 2D. For example, the upper surface of the first driving connector portion 106c' may be lower than upper surfaces of the first driving active portion 106a' and the first driving body contact portion 106b'. In one embodiment, the planar configuration of the second driving semiconductor pattern 108 may be the same as the planar configuration of the first driving semiconductor pattern 105'.

Figure 4:
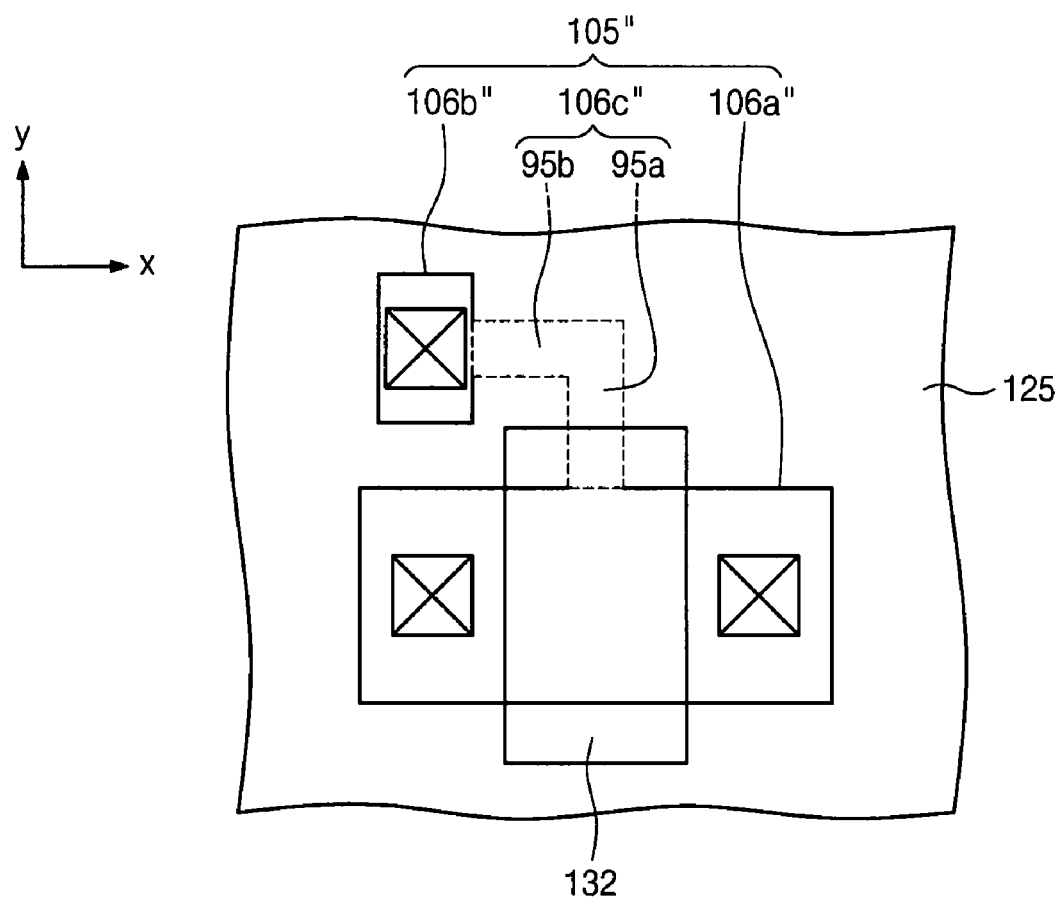
FIG. 4 is a plan view illustrating a planar configuration of the first driving semiconductor pattern, according to yet another embodiment.

FIG. 4 is a plan view illustrating a planar configuration of the first driving semiconductor pattern in the semiconductor device shown in FIG. 1, according to yet another embodiment.

Referring to FIG. 4, the first driving semiconductor pattern 105 described above with respect to FIG. 1 may have a planar configuration corresponding to the first driving semiconductor pattern 105". As shown in FIG. 4, the first driving semiconductor pattern 105" may include a first driving active portion 106a", a first driving body contact portion 106b" spaced apart from the first driving active portion 106a" and a first driving connector portion 106c" connecting the first driving active portion 106a" to the first driving body contact portion 106b". As exemplarily illustrated, the first driving connector portion 106c" includes a first part 95a extending along the first direction (e.g., the "y" direction) and a second part 95b extending in a different direction. For example, the second part 95b may extend along the second direction (e.g., the "x" direction). The first part 95a may include one end connected to the first driving body contact portion 106b" and another end connected to the second part 95b. The second part 95b may include one end connected to the first driving active portion 106a" and another end connected to the first part 95a. Other than the planar configuration exemplarily described above, the first driving semiconductor pattern 105" is the same as the first driving semiconductor pattern 105 discussed above with respect to FIGS. 1, 2C and 2D. For example, the upper surface of the first driving connector portion 106c" may be lower than upper surfaces of the first driving active portion 106a" and the first driving body contact portion 106b". In one embodiment, the planar configuration of the second driving semiconductor pattern 108 may be the same as the planar configuration of the first driving semiconductor pattern 105".

Although exemplary planar configurations of the first driving semiconductor pattern 105 (or 105' or 105") and the second driving semiconductor pattern 108 have been described above with respect to FIGS. 1, 3 and 4, it will be appreciated that the planar configurations of the first driving semiconductor pattern and the second driving semiconductor pattern may be provided in any manner to ensure that the locations of the first driving body contact portion 106 (or 106' or 106"), the second driving body contact portion 109 (or 109' or 109"), the first driving gate pattern 132 and the second driving gate pattern 134.

Generally, a semiconductor device according to some embodiments described herein can be formed in an exemplary method which includes forming a plurality of devices in a substrate to form a lower level device layer over the substrate, forming an interlayer insulating film over the lower level device layer and forming a plurality of semiconductor patterns over the interlayer insulating film. The plurality of semiconductor patterns may include a semiconductor material and the plurality of semiconductor patterns may be electrically isolated from each other. As described above, at least one of the plurality of semiconductor patterns may include at least one active portion and at least one body contact portion electrically connected to the at least one active portion. The aforementioned method may further include forming at least one device in the at least one active portion of each of the plurality of semiconductor patterns. Upon forming at least one device in the at least one active portion of each of the plurality of semiconductor, an upper level device layer is thereby formed. Exemplary embodiments of a method of forming the semiconductor device described above with respect to FIGS. 1 and 2A-2D is provided below with respect to FIGS. 5A-5D, 6A-6D, 7A-7D, 8A-8D and 9A-9D.

FIGS. 5A, 6A, 7A, 8A and 9A are cross-sectional views taken along line I-I' shown in FIG. 1, illustrating a method of fabricating the semiconductor device shown in FIG. 2A, according to one embodiment. FIGS. 5B, 6B, 7B, 8B and 9B are cross-sectional views taken along line II-II' shown in FIG. 1, illustrating a method of fabricating the semiconductor device shown in FIG. 2B, according to one embodiment. FIGS. 5C, 6C, 7C, 8C and 9C are cross-sectional views taken along line III-III' shown in FIG. 1, illustrating a method of fabricating the semiconductor device shown in FIG. 2C, according to one embodiment. FIGS. 5D, 6D, 7D, 8D and 9D are cross-sectional views taken along line IV-IV' shown in FIG. 1, illustrating a method of fabricating the semiconductor device shown in FIG. 2D, according to one embodiment.

Referring to FIGS. 5A-5D, the lower level device layer 90 is formed in the semiconductor substrate 50. The lower level device layer 90 may include one or more logic devices, one or more memory cells, or the like or a combination thereof. In the illustrated embodiment, the lower level device layer 90 includes a plurality of memory cells. Accordingly, a device separating pattern 60 is formed in the semiconductor substrate 50 to define a plurality of substrate active portions. Subsequently, a lower level tunnel insulating film 62 and a lower level charge storage layer 64 are sequentially formed over each substrate active portion. A plurality of lower level blocking insulator patterns 66 and lower level control gate patterns 68 are then sequentially formed to extend over each of the plurality of substrate active portions. In one embodiment, the lower level charge storage layer 64 may be provided as a floating gate formed of a semiconductor material. In one embodiment, the lower level tunnel insulating film 52 and the lower level charge storage layer 64 may be formed in a self-aligned manner, as is known in the art. A plurality of lower level cell source/drain regions 70 may be formed within the plurality of substrate active portions at opposite sides of each of the lower level control gate patterns 68.

Next, a lower interlayer insulating film 100 is formed over the semiconductor substrate 50 and the lower level device layer 90. A semiconductor film 102 is then formed on the lower interlayer insulating film 100. In one embodiment, the semiconductor film 102 includes a semiconductor material having a monocrystalline state. In one embodiment, the semiconductor material may include silicon, germanium, silicon-germanium, or the like or a combination thereof. The semiconductor film 102 can be formed by substrate bonding, an epitaxial growth method, a solid-state crystallization method, or the like or a combination thereof.

In one embodiment, a substrate bonding method may be performed by bonding a carrier substrate having a detachable layer and a surface monocrystalline semiconductor layer to the upper surface of the lower interlayer insulating film 100. The carrier substrate is then separated from the detachable layer, thereby leaving the surface monocrystalline semiconductor layer on the lower interlayer insulating film 100 as the semiconductor layer 102.

In one embodiment, an epitaxial growth method may be performed by forming a hole through the lower interlayer insulating film 100 to expose the semiconductor substrate 50. An epitaxial growth process is then carried out to form an epitaxial layer over the exposed surface of the semiconductor substrate 50. The epitaxial layer is then continuously grown to fill the hole and spread out to cover the surface of the lower interlayer insulating film 100.

In one embodiment, a solid-phase crystallization method may be performed by forming a monocrystalline semiconductor pattern within the insulating layer 100. The monocrystalline semiconductor layer may be formed using an epitaxial growth procedure in which the semiconductor substrate 50 is used as a seed. An amorphous semiconductor film is then formed over the surface of the lower interlayer insulating film 100 so as to contact the monocrystalline semiconductor pattern formed in the insulating layer 100. Subsequently, an annealing procedure is performed to transform the amorphous semiconductor film into the monocrystalline semiconductor pattern, which is the semiconductor film 102.

Next, a tunnel insulating film 111 (see FIGS. 5A and 5B) is formed on the semiconductor film 102 in a cell array region 10 and a driving gate insulating film 112 (see FIGS. 5C and 5D) is formed on the semiconductor film 102 in a driving circuit device region 15. In one embodiment, the driving gate insulating film 112 is thicker than the tunnel insulating film 111. In one embodiment, the tunnel insulating film 111 and the driving gate insulating film 112 may be formed by forming the driving gate insulating film 112 on the semiconductor film 102 in the cell array region 10 and in the driving circuit device region 15. Next, the portion of the driving gate insulating film 112 in the cell array region 10 is selectively removed to expose an upper surface of the semiconductor film 102 in the cell array region 10. Accordingly, the portion of the driving gate insulating film 112 disposed in the driving circuit device region 15 remains. Subsequently, the tunnel insulating film 111 is formed over the exposed surface of the semiconductor film 102.

Next, a charge storage film such as a floating gate film 114, and a hard mask film 116, are sequentially formed on the semiconductor substrate 50. In one embodiment, the floating gate film 114 may include a semiconductor material. In one embodiment, the hard mask layer 116 may include a material that has a etch selectivity different from the floating gate film 115, tunnel insulating film 111, driving gate insulating film 112 and the semiconductor film 102. For example, the hard mask film 116 may include a material such as a nitride (e.g., a silicon nitride layer, a double layer including silicon nitride disposed on silicon oxide, or the like).

As mentioned above, a semiconductor device may be formed in an exemplary method which includes forming a plurality of semiconductor patterns over an interlayer insulating film. In one embodiment, the plurality of semiconductor patterns may be formed by patterning the semiconductor material of a semiconductor film to form at least one recess region, wherein the semiconductor material forms a bottom surface of the at least one recess region. The plurality of semiconductor patterns may further be formed by patterning the semiconductor material of the semiconductor film to form an isolation trench, wherein the interlayer insulating film forms a bottom surface of the isolation trench. An exemplary discussion of such a method of forming a plurality of semiconductor patterns is provided below with respect to FIGS. 6A-6D and 7A-7D.

Referring to FIGS. 6A-6D, the hard mask film 116 is patterned to form a cell hard mask pattern 117 (see FIGS. 6A and 6B), a first driving hard mask pattern 118 (see FIGS. 6C and 6D) and a second driving hard mask pattern 119 (see FIG. 6C). The cell hard mask pattern 117, the first driving hard mask pattern 118 and the second driving hard mask pattern 119 may be collectively referred to as a "hard mask pattern." The floating gate film 114, the tunnel insulating film 111, the driving gate insulating film 112 and the semiconductor film 102 are sequentially etched using the cell hard mask pattern 117, the first driving hard mask pattern 118 and the second driving hard mask pattern 119 as etching masks to form an isolation trench 120. Thus, the floating gate film 114, the tunnel insulating film 111, the driving gate insulating film 112 and the semiconductor material of the semiconductor film 102 may be patterned using the same hard mask pattern used to form the isolation trench 120.

Portions of the lower interlayer insulating film 100 are exposed by the isolation trench 120. Accordingly, the isolation trench 120 defines the cell semiconductor pattern 103, the first driving semiconductor pattern 105 and the second driving semiconductor pattern 108. The cell semiconductor pattern 103, the first driving semiconductor pattern 105 and the second driving semiconductor pattern 108 are completely separated from each other by the isolation trench 120. The cell hard mask pattern 117, the first driving hard mask pattern 118 and the second driving hard mask pattern 119 are disposed on the cell semiconductor pattern 103, the first driving semiconductor pattern 105 and the second driving semiconductor pattern 108, respectively.

Referring to FIGS. 7A-7D, the cell hard mask pattern 117, the first driving hard mask pattern 118 and the second driving hard mask pattern 119 are patterned to form a cell recess hard mask pattern 117a, a first driving recess hard mask pattern 118a and a second driving recess hard mask pattern 119a, respectively. The cell recess hard mask pattern 117a, the first driving recess hard mask pattern 118a and the second driving recess hard mask pattern 119a may be collectively referred to herein as a "recess hard mask pattern."

Figures 7A, 7B:
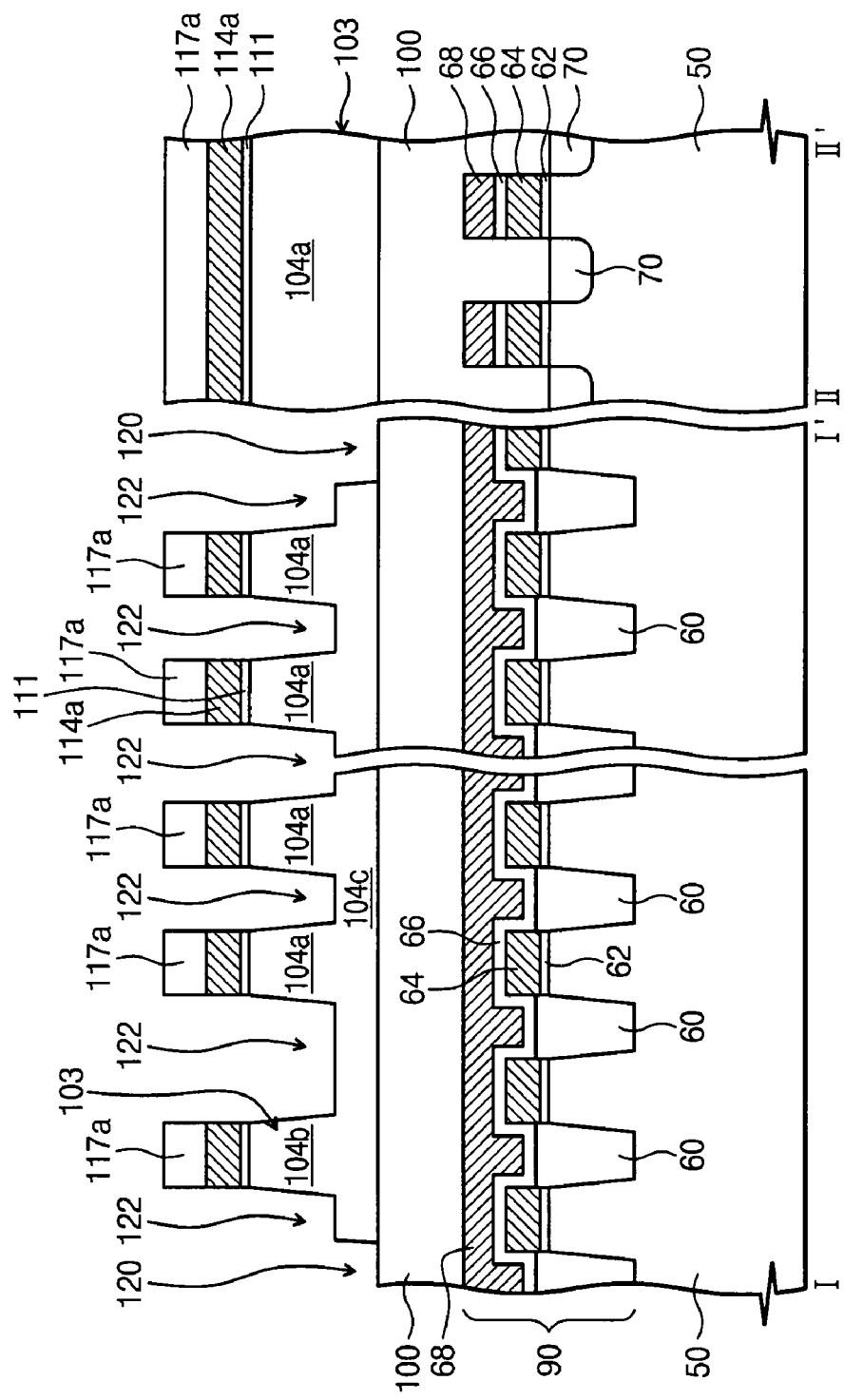

As shown in FIGS. 7A and 7B, the floating gate film 114, the tunnel insulating film 111 and the material of the cell semiconductor pattern 103 are sequentially etched using the cell recess hard mask pattern 117a as an etching mask to form a plurality of cell recess regions 122. Thus, the floating gate film 114, the tunnel insulating film 111 and the semiconductor material of the semiconductor film 102 may be patterned using the same recess hard mask pattern used to form the plurality of cell recess regions 122. As shown in FIGS. 7C and 7D, the floating gate film 114, the driving gate insulating film 112 and the first driving semiconductor pattern 105 are sequentially etched using the first driving recess hard mask pattern 118a as an etching mask to form the first driving recess region 123. Thus, the floating gate film 114, the driving gate insulating film 112 and the semiconductor material of the semiconductor film 102 may be patterned using the same recess hard mask pattern used to form the first driving recess region 123. Although not illustrated, the floating gate film 114, the driving gate insulating film 112 and the second driving semiconductor pattern 108 are sequentially etched using the second driving recess hard mask pattern 118a as an etching mask to form the second recess region, similar to the first driving recess region 123. Thus, the floating gate film 114, the driving gate insulating film 112 and the semiconductor material of the semiconductor film 102 may be patterned using the same recess hard mask pattern used to form the second driving recess region. The plurality of cell recess regions 122, the first driving recess region 123 and the second recess region may be formed during the same etching process.

In one embodiment, the bottom surfaces of each of the plurality of cell recess regions 122, the first driving recess region 123 and the second driving recess region are above than the upper surface of the lower interlayer insulating film 100. Accordingly, the bottom surfaces of each of the plurality of cell recess regions 122, the first driving recess region 123 and the second driving recess region are above bottom surfaces of the cell semiconductor pattern 103, the first driving semiconductor pattern 105 and second driving semiconductor pattern 108.

Upon forming the plurality of cell recess regions 122, the first driving recess region 123 and the second driving recess region, the floating gate film 114 is patterned to form a plurality of preliminary floating gates 114a, a first driving preliminary lower gate pattern 115a and a second driving preliminary lower gate pattern 115b under the cell recess hard mask pattern 117a, the first driving recess hard mask pattern 118a and the second driving recess hard mask pattern 119a, respectively.

As exemplarily illustrated, the plurality of cell recess regions 122 formed in the cell semiconductor pattern 103 defines the plurality cell active portions 104a, the cell body contact portion 104b and the cell dummy active portion 104d. The first driving recess region 123 formed in the first driving semiconductor pattern 105 defines the first driving active portion 106a, the first driving connector portion 106c and the first driving body contact portion 106b. The second driving recess patterned formed in the second driving semiconductor pattern 108 defines the second driving active portion 109a, the second driving connector portion 109c and the second driving body contact portion 109b.

In one embodiment, the etching process using the cell recess hard mask pattern 117a, the first driving recess hard mask pattern 118a and the second driving recess hard mask pattern 119a as etching masks can be performed before a photoresist pattern used to form cell recess hard mask pattern 117a, the first driving recess hard mask pattern 118a and the second driving recess hard mask pattern 119a is removed. In such an embodiment, the photoresist pattern protects the lower interlayer insulating film 100 exposed by the isolation trench 120 because the photoresist pattern fills the isolation trench 120. The photoresist pattern can be removed after the plurality of cell recess regions 122, the first driving recess region 123 and the second driving recess region are formed.

As exemplarily discussed above with respect to FIGS. 6A-6D and 7A-7D, the cell semiconductor pattern 103, the first driving semiconductor pattern 105 and the second driving semiconductor pattern 108 may be formed by patterning the semiconductor material of the semiconductor film 102 to form the plurality of cell recess regions 122, the first driving recess region 123 and the second driving recess region, respectively, wherein the semiconductor material forms bottom surfaces of the aforementioned recess regions. The cell semiconductor pattern 103, the first driving semiconductor pattern 105 and the second driving semiconductor pattern 108 may further be formed by patterning the semiconductor material of the semiconductor film 102 to form the isolation trench 120, wherein the lower interlayer insulating film 100 forms a bottom surface of the isolation trench 120. Although FIGS. 6A-6D and 7A-7D illustrate wherein the semiconductor material is patterned to form the isolation trench 120 before the semiconductor material is patterned to form the aforementioned recess regions, it will be appreciated that the semiconductor material may be patterned to form the aforementioned recess regions before the semiconductor material is patterned to form the isolation trench 120.

Referring to FIGS. 8A-8D, an insulator film may be provided to fill the isolation trench 120, the plurality of cell recess regions 122, the first driving recess region 123 and the second driving recess region. Subsequently, the thickness of the insulator film is reduced (e.g., by planarization, etch-back, or the like or a combination thereof) until the cell recess hard mask pattern 117a, the first driving recess hard mask pattern 118a and the second driving recess hard mask pattern 119a are exposed, thereby forming the device separating film 125. The cell recess hard mask pattern 117a, the first driving recess hard mask pattern 118a and the second driving recess hard mask pattern 119a are then removed to expose the plurality of preliminary floating gates 114a, the preliminary first driving lower gate pattern 115a and the preliminary second driving lower gate pattern 115b.

Referring to FIGS. 9A-9D, the thickness of the device separating film 125 may be reduced (e.g., by planarization, etch-back, or the like or a combination thereof) until sidewalls of the plurality of preliminary floating gates 114a, the preliminary first driving lower gate pattern 115a and the preliminary second driving lower gate pattern 115b are exposed. By exposing sidewalls of the plurality of preliminary floating gates 114a, the amount of overlap between a subsequently-formed floating gate and a control gate pattern may be increased, thereby increasing a coupling ratio of a subsequently-formed memory cell.

Next, a blocking insulator film 127 is formed over the plurality of preliminary floating gates 114a, the preliminary first driving lower gate pattern 115a, the preliminary second driving lower gate pattern 115b and the device separating film 125. The blocking insulator film 127 is then patterned to form a first driving opening 128a and a second driving opening 128b exposing the first driving preliminary lower gate pattern 115a and the second driving preliminary lower gate pattern 115b, respectively. Subsequently, a gate conductive film 130 is formed over the blocking insulator film 127. As exemplarily illustrated, the gate conductive film 130 fills the first driving opening 128a and the second driving opening 128b to directly contact the first driving preliminary lower gate pattern 115a and the second driving preliminary lower gate pattern 115b.

Next, portions of the gate conductive film 130 and the blocking insulator film 127 in the cell array region 10 and the plurality of preliminary floating gates 114a are sequentially patterned to form the plurality of control gates 130a, the plurality of blocking insulator patterns 127a and the plurality of floating gates 114b, respectively, as shown in FIGS. 1, 2A and 2B, thereby forming a plurality of memory cells. In one embodiment, the portion of the preliminary floating gate pattern 114a formed on the cell body contact portion 104b is removed.

As exemplarily discussed above, at least one device in at least one active portion of each of the plurality of semiconductor patterns may be formed by a method which includes forming a charge storage film such as the floating gate film 114 over a semiconductor material of the semiconductor film 102, followed by patterning the floating gate film 114 to form a charge storage pattern such as the floating gate pattern 114b. As exemplarily described with respect to FIGS. 5A and 5B, the floating gate film 114 may be formed over the semiconductor material of the semiconductor film 102 before the semiconductor film 102 is patterned to form the isolation trench 120. As exemplarily described with respect to FIGS. 6A and 6B, the floating gate film 114 may be patterned to form the floating gate pattern 114b by a method which includes forming the hard mask pattern (i.e., the cell hard mask pattern 117) over the floating gate film 114 and, in the same patterning process used to form the isolation trench 120, patterning the floating gate film 114 using the cell hard mask pattern 117 as a mask. As exemplarily described with respect to FIGS. 7A and 7B, the floating gate film 114 may be patterned to form the floating gate pattern 114b by a method which includes forming the recess hard mask pattern (i.e., the cell recess hard mask pattern 117a) over the floating gate film 114 and, in the same patterning process used to form the plurality of cell recess regions 122, patterning the floating gate film 114 using the cell recess hard mask pattern 117a as a mask.

During the aforementioned process of forming the plurality of memory cells, the portion of the gate conductive film 130 and the blocking insulator film 127 in the driving circuit device region 15 and the preliminary first driving lower gate pattern 115a are sequentially patterned to form the first driving upper gate pattern 130b, the first driving inter-gate pattern 127b and the first driving lower gate pattern 115a', respectively, as shown in FIGS. 1, 2C and 2D, thereby forming the first driving gate pattern 132. In one embodiment, a portion of the preliminary first driving lower gate pattern 115a formed on the first driving body contact portion 106b is removed.

Similarly, during the aforementioned process of forming the plurality of memory cells and the first driving gate pattern 132, the portion of the gate conductive film 130 and the blocking insulator film 127 in the driving circuit device region 15 and the preliminary second driving lower gate pattern 115b are sequentially patterned to form the second driving upper gate pattern 130c, the second driving inter-gate pattern 127c and the second driving lower gate pattern 115b', respectively, as shown in FIGS. 1 and 2C, thereby forming the second driving gate pattern 134. In one embodiment, a portion of the preliminary second driving lower gate pattern 115b formed on the second driving body contact portion 109b is removed. Thus, the control gate pattern 130a, the first driving upper gate pattern 130a and the second driving upper gate pattern 130b can be formed simultaneously.

Using the control gate pattern 130a as a mask, a first dopant is ion-implanted to form the cell source/drain region 131 shown in FIGS. 2A and 2B. Using the first driving gate pattern 132 as a mask, a second dopant is ion-implanted to form the first driving source region 133s and first driving drain region 133d shown in FIGS. 2C and 2D. Using the second driving gate pattern 134 as a mask, a third dopant is ion-implanted to form the second driving source region 135s and second driving drain region 135d shown in FIG. 2C. A fourth dopant may be selectively ion-implanted to form the cell body contact doped region 137 shown in FIG. 2A. A fifth dopant may be selectively ion-implanted to form the first driving body contact doped region 138 shown in FIG. 2D.

Next, the upper interlayer insulating film 140, as well as the cell pickup plug 141, the first source plug 142s, the first drain plug 142d, the second source plug 144s, the second drain plug 144d, the first driving pickup plug 146a and the second driving pickup plug 146b are formed, thereby providing the structure shown in FIGS. 1 and 2A-2D.

According to the embodiments exemplarily described above, each of the plurality of memory cells in the cell array region 10 may include a charge storage pattern provided as a structure such as a floating gate pattern. It will be appreciated, however, that the charge storage layer may be provided as any other structure. It will also be appreciated that at least one of the plurality of memory cells may be provided as any type of semiconductor memory device including, for example, a phase-change memory device, a magneto-resistance memory device, or the like. An exemplary semiconductor device according to another embodiment will be described below with respect to FIGS. 10A-10D.

FIGS. 10A-10D are cross-sectional views of the semiconductor device shown in FIG. 1, taken along lines I-I', II-II', III-III' and IV-IV' of FIG. 1, respectively, according to another embodiment.

Referring to FIGS. 10A-10D, a lower level device layer 90a is formed in the semiconductor substrate 50 and includes a plurality of devices. The lower level device layer 90a may include a plurality of devices such as memory cells. In the illustrated embodiment, each memory cell may include a lower level tunnel insulating film 62, a lower level trap insulating film 64a, a lower level blocking insulator pattern 127a and a lower level control gate 68a sequentially formed on a corresponding substrate active portion, in addition to the aforementioned lower level cell source/drain region 70.

In one embodiment, the lower level trap insulating film 64a may include a dielectric material containing a plurality of traps for storing charges. For example, the lower level trap insulating film 64a may include a bulk nitride material (e.g., silicon nitride), a bulk dielectric material including a plurality of nano-dots disposed therein and separated from each other, or the like or a combination thereof. As charges accumulate in the traps, the lower level trap insulating film 64a can be connected to the lower level trap insulating films 64a of neighboring memory cells arranged along the length of the control gate 68a. In one embodiment, the lower level control gate 68a may include a first layer 67a and a second layer 67b formed on the first layer 67a. The first layer 67a may contain a conductive material with a work function of at least 4 eV. The second layer 67b may contain a conductive material with a low specific resistance (e.g., a metal).

The lower interlayer insulating film 100 is formed on the lower level device layer 90a and an upper level device layer 92a is formed on the lower interlayer insulating film 100. As exemplarily discussed above, the upper level device layer 92a may include a cell array region 10 and a driving circuit device region 15, wherein the cell array region 10 may include a plurality of devices such as a plurality of memory cells and the driving circuit device region 15 may include a plurality of devices such as a plurality of driving transistors.

In the illustrated embodiment, the cell array region 10 may include a cell semiconductor pattern 103 formed on the lower interlayer insulating film 100. A plurality of memory cells may be formed in the cell semiconductor pattern 103. Each of the plurality of memory cells may include a tunnel insulating film 111, a charge storage pattern such as a trap insulating pattern 200a, a blocking insulator pattern 127a, and a control gate pattern 206, which are sequentially deposited on a corresponding one of the plurality of cell active portions 104a.

In one embodiment, the trap insulating pattern 200a may include a dielectric material containing a plurality of traps for storing charges. For example, the lower level trap insulating film 200a may include a bulk nitride material (e.g., silicon nitride), a bulk dielectric material including a plurality of nano-dots disposed therein and separated from each other, or the like or a combination thereof. As charges accumulate in the traps, the trap insulating pattern 200a can be connected to the trap insulating patterns 200a of neighboring memory cells that are arranged along the length of the control gate pattern 206. In one embodiment, the control gate pattern 206 may include a first layer 202a and a second layer 204a formed on the first layer 202a. The first layer 202a may contain a conductive material with a work function of at least 4 eV. The first layer 202a may also contain a conductive material that is highly unreactive with the blocking insulator pattern 127a. The second layer 204a may contain a conductive material with a low specific resistance (e.g., a metal). In this manner, the resistance of the control gate pattern 206 can be reduced, which makes it possible to realize a semiconductor device that operates at a high speed.

The first driving gate pattern 132a is disposed on the first driving active portion 106a of the first driving semiconductor pattern 105, which is on the lower interlayer insulating film 100 in the driving circuit device region 15. The second driving gate pattern 134a is disposed on the second driving active portion 109a of the second driving semiconductor pattern 108, which is on the lower interlayer insulating film 100. The first driving gate pattern 132a and the second driving gate pattern 134a may include the same material as the second layer 204a of the control gate pattern 206.

Exemplary embodiments of a method of forming the semiconductor device described above with respect to FIGS. 1 and 10A-10D is provided below with respect to FIGS. 11A-11D, 12A-12D and 13A-13D.

Figures 12A, 12B:
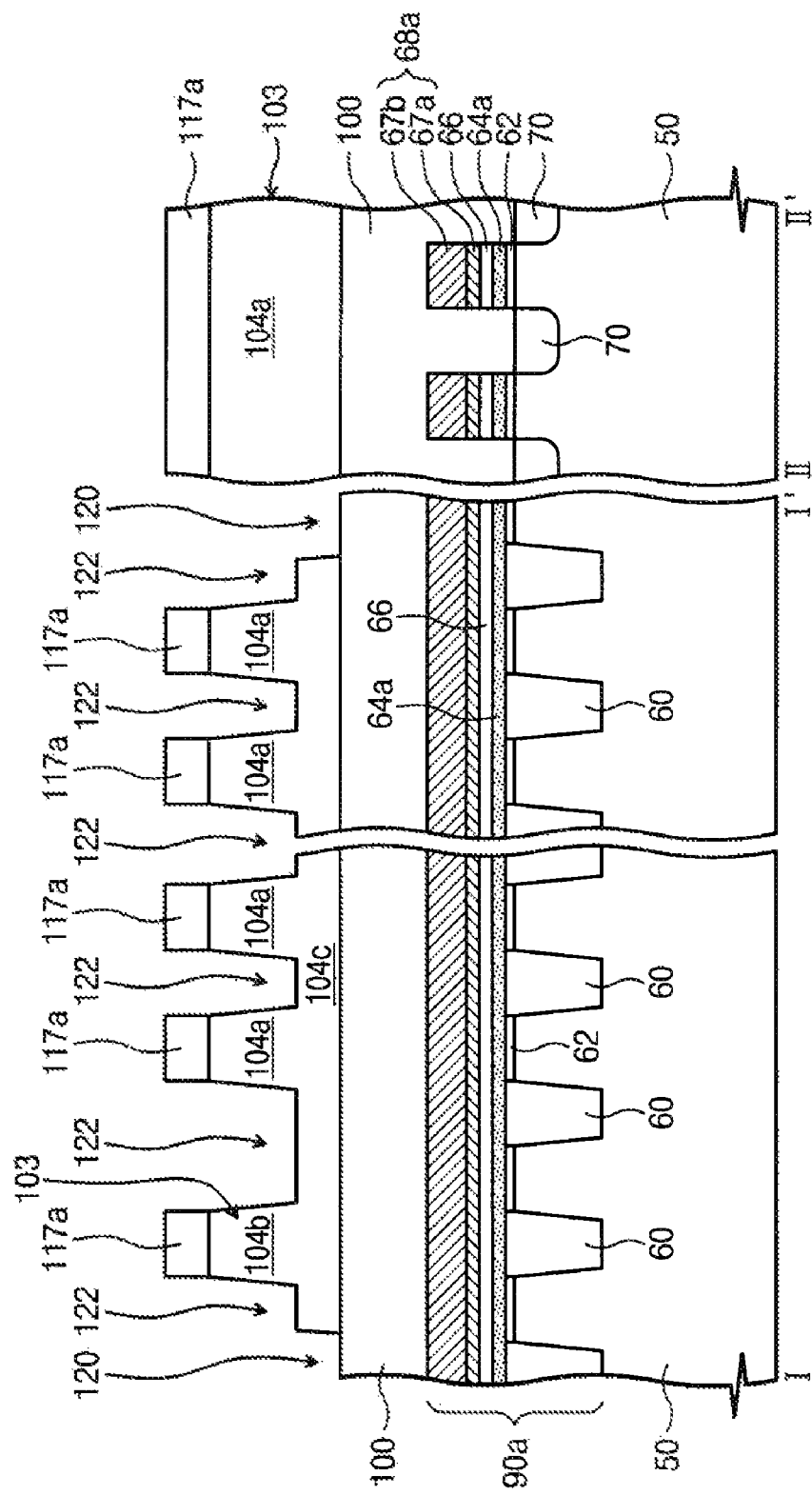

FIGS. 11A, 12A and 13A are cross-sectional views taken along line I-I' shown in FIG. 1, illustrating a method of fabricating the semiconductor device shown in FIG. 10A, according to one embodiment. FIGS. 11B, 12B and 13B are cross-sectional views taken along line II-II' shown in FIG. 1, illustrating a method of fabricating the semiconductor device shown in FIG. 10B, according to one embodiment. FIGS. 11C, 12C and 13C are cross-sectional views taken along line III-III' shown in FIG. 1, illustrating a method of fabricating the semiconductor device shown in FIG. 10C, according to one embodiment. FIGS. 11D, 12D and 13D are cross-sectional views taken along line IV-IV' shown in FIG. 1, illustrating a method of fabricating the semiconductor device shown in FIG. 10D, according to one embodiment.

Referring to FIGS. 11A-11D, the lower level device layer 90a is formed on the semiconductor substrate 50 and the lower interlayer insulating film 100 is formed over the lower level device layer 90a. The semiconductor film 102 and the hard mask film 116 are then sequentially formed over the lower interlayer insulating film 100.

As mentioned above, a semiconductor device may be formed in an exemplary method which includes forming a plurality of semiconductor patterns over an interlayer insulating film. In one embodiment, the plurality of semiconductor patterns may be formed by patterning the semiconductor material of a semiconductor film to form at least one recess region, wherein the semiconductor material forms a bottom surface of the at least one recess region. The plurality of semiconductor patterns may further be formed by patterning the semiconductor material of the semiconductor film to form an isolation trench, wherein the interlayer insulating film forms a bottom surface of the isolation trench. An exemplary discussion of such a method of forming a plurality of semiconductor patterns is provided below with respect to FIGS. 12A-12D.

Referring to FIGS. 12A-12D, the hard mask film 116 is then patterned to form a cell hard mask pattern 117, a first driving hard mask pattern 118 and a second driving hard mask pattern 119 as exemplarily described above with respect to FIGS. 6A, 6B, 6C and 6D. The semiconductor film 102 is then etched using the cell hard mask pattern 117, the first driving hard mask pattern 118 and the second driving hard mask pattern 119 as etching masks to form an isolation trench 120 as exemplarily described above with respect to FIGS. 6A, 6B, 6C and 6D. Portions of the lower interlayer insulating film 100 are exposed by the isolation trench 120. As discussed above, the isolation trench 120 defines the cell semiconductor pattern 103, the first driving semiconductor pattern 105 and the second driving semiconductor pattern 108. The cell semiconductor pattern 103, the first driving semiconductor pattern 105 and the second driving semiconductor pattern 108 are completely separated from each other by the isolation trench 120.

The cell hard mask pattern 117, the first driving hard mask pattern 118 and the second driving hard mask pattern 119 are then patterned to form the a cell recess hard mask pattern 117a, a first driving recess hard mask pattern 118a and a second driving recess hard mask pattern 119a, respectively, as exemplarily described above with respect to FIGS. 7A, 7B, 7C and 7D. As shown in FIGS. 12A and 12B, the cell semiconductor pattern 103 is etched using the cell recess hard mask pattern 117a as an etching mask to form a plurality of cell recess regions 122. As shown in FIGS. 12C and 12D, the first driving semiconductor pattern 105 is etched using the first driving recess hard mask pattern 118a as an etching mask to form the first driving recess region 123. Although not illustrated, the second driving semiconductor pattern 108 is etched using the second driving recess hard mask pattern 118a as an etching mask to form the second recess region, similar to the first driving recess region 123.

As exemplarily discussed above with respect to FIGS. 12A-12D, the cell semiconductor pattern 103, the first driving semiconductor pattern 105 and the second driving semiconductor pattern 108 may be formed by patterning the semiconductor material of the semiconductor film 102 to form the plurality of cell recess regions 122, the first driving recess region 123 and the second driving recess region, respectively, wherein the semiconductor material forms bottom surfaces of the aforementioned recess regions. The cell semiconductor pattern 103, the first driving semiconductor pattern 105 and the second driving semiconductor pattern 108 may further be formed by patterning the semiconductor material of the semiconductor film 102 to form the isolation trench 120, wherein the lower interlayer insulating film 100 forms a bottom surface of the isolation trench 120. Although FIGS. 12A-12D illustrate wherein the semiconductor material is patterned to form the isolation trench 120 before the semiconductor material is patterned to form the aforementioned recess regions, it will be appreciated that the semiconductor material may be patterned to form the aforementioned recess regions before the semiconductor material is patterned to form the isolation trench 120

Referring to FIGS. 13A-13D, with the cell hard mask pattern 117a on the cell semiconductor pattern 103 (i.e., the plurality of cell active portions 104a and the cell body contact portion 104b), the first driving hard mask pattern 118a on the first driving semiconductor pattern 105 (i.e., the first driving active portion 106a and the first driving body contact portion 106b), and the second driving hard mask pattern 119a on the second driving semiconductor pattern 108 (i.e., the second driving active portion 109a and the second driving body contact portion 109b), an insulator film is formed to fill the plurality of cell recess regions 122, the first driving recess region 123, the second driving recess region and the isolation trench 120. Subsequently, the thickness of the insulator film is reduced (e.g., by planarization, etch-back, or the like or a combination thereof) until the cell recess hard mask pattern 117a, the first driving recess hard mask pattern 118a and the second driving recess hard mask pattern 119a are exposed, thereby forming the device separating film 125. After forming the device separating film 125, the cell recess hard mask pattern 117a, the first driving recess hard mask pattern 118a and the second driving recess hard mask pattern 119a are removed.

Next, the tunnel insulating film 111 is formed on the plurality of cell active portions 104a and the cell body contact portion 104b of the cell semiconductor pattern 103, on the first driving active portion 106a and the first driving body contact portion 106b of the first driving semiconductor pattern 105, and on the second driving active portion 109a and the second driving body contact portion 109b of the second driving semiconductor pattern 108. A charge storage film such as a trap insulating film 200, a blocking insulator film 127 and a first conductive film 202 are then sequentially formed on the tunnel insulating film 111 and the device separating film 125 in the cell array region 10 and in the driving circuit device region 15. Portions of the first conductive film 202, the blocking insulator film 127, the trap insulating film 200 and tunnel insulating film 111 in the driving circuit device region 15 are then removed to expose the first driving active portion 106a and the first driving body contact portion 106b of the first driving semiconductor pattern 105 as well as the second driving active portion 109a and the second driving body contact portion 109b of the second driving semiconductor pattern 108.

Next, the driving gate insulating film 112 is formed over the exposed first driving active portion 106a and first driving body contact portion 106b of the first driving semiconductor pattern 105 as well as the exposed second driving active portion 109a and second driving body contact portion 109b of the second driving semiconductor pattern 108.

Next, the second conductive film 204 is formed on portions of the device separating film 125 in the cell array region 10 and the driving circuit region 51, on first conductive film 202 in the cell array region 10 and on the driving gate insulating film 112 in the driving circuit device region 15.

Next, the portion of the second conductive film 204 in the cell array region 10 as well as the first conductive film 202, the blocking insulator film 127 and trap insulating film 200 are sequentially patterned to form the control gate pattern 206, the blocking insulator pattern 127a, and the trap insulating pattern 200a as shown in FIGS. 10A and 10B. In one embodiment, portions of the first conductive film 202 and the second conductive film 204 on the cell body contact portion 104b are removed.

During the aforementioned process of forming the plurality of memory cells, a portion of the second conductive film 204 on the first driving semiconductor pattern 105 in the driving circuit device region 15 is patterned to form the first driving gate pattern 132a shown in FIGS. 10C and 10D. Similarly, during the aforementioned process of forming the plurality of memory cells and the first driving gate pattern 132a, a portion of the second conductive film 204 on the second driving semiconductor pattern 108 in the driving circuit device region 15 is patterned to form the second driving gate pattern 134a shown in FIG. 10C. Thus, the control gate pattern 206, the first driving gate pattern 132a and the second driving gate pattern 134a can be formed simultaneously.

In one embodiment, the blocking insulator film 127 can be used as an etching stopper layer when forming the control gate pattern 206. In such an embodiment, and although not illustrated, the blocking insulator film 127 and the trap insulating film 200 of one memory cell may be connected to the blocking insulator film 127 and the trap insulating film 200 of adjacent memory cells along the aforementioned first direction (i.e., the "y" direction shown in FIG. 1) and the aforementioned second direction (i.e., the "x" direction shown in FIG. 1).

As exemplarily discussed above, at least one device in at least one active portion of each of the plurality of semiconductor patterns may be formed by a method which includes forming a charge storage film such as the trap insulating film 200 over a semiconductor material of the semiconductor film 102, followed by patterning the trap insulating film 200 to form a charge storage pattern such as the trap insulating pattern 200b. As exemplarily described with respect to FIGS. 5A and 5B, the trap insulating film 200 may be formed over the semiconductor material of the semiconductor film 102 after the semiconductor film 102 is patterned to form the isolation trench 120.

Subsequently, the upper interlayer insulating film 140, the cell pickup plug 141, the first source plug 142s, the first drain plug 142d, the second source plug 144s, the second drain plug 144d, the first driving pickup plug 146a and the second driving pickup plug 146b may be formed as exemplarily described above with respect to FIGS. 2A-2D to obtain the structure shown in FIGS. 10A-10D.

Figure 14:
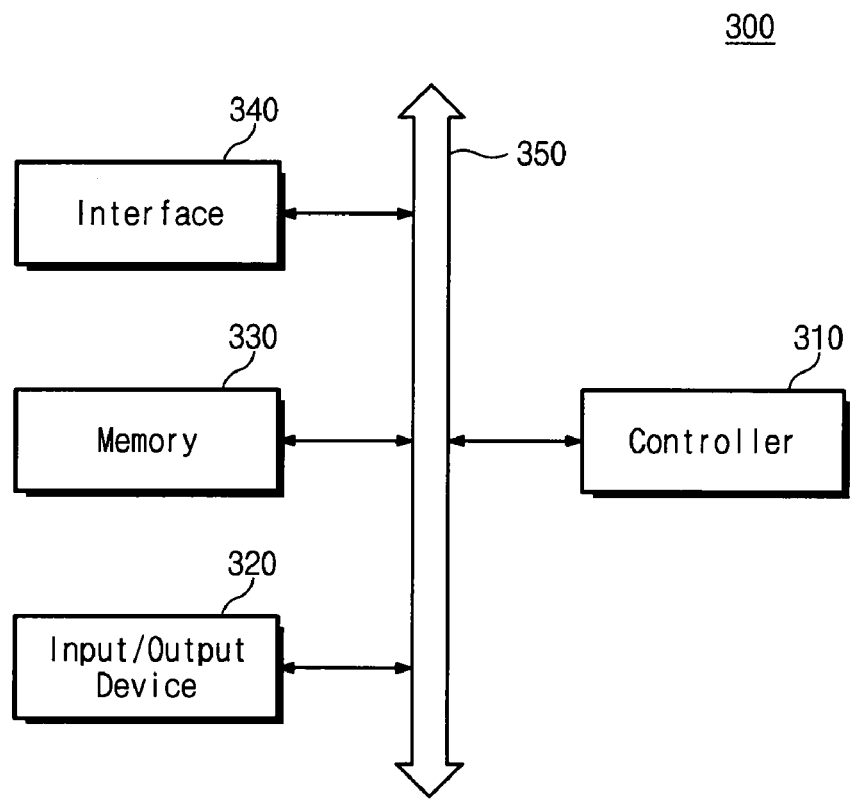
FIG. 14 is a block diagram schematically illustrating an electronic system incorporating a semiconductor device, according to one embodiment.

FIG. 14 is a block diagram schematically illustrating an electronic system incorporating a semiconductor device, according to one embodiment.

Referring to FIG. 14, an electronic system 300 may, for example, include a controller 310, an input/output device 320 and a memory device 330. The controller 310, input/output device 320 and memory 330 may be connected to one another by a bus 350. Accordingly, the bus 350 may be provided as any path through which data are transferred.

In one embodiment, the controller 310 may include one or more logic devices included within a semiconductor device as exemplarily described above with respect to FIGS. 1, 2A-2D and 10A-10D. Thus, the controller 310 may be incorporated within a single semiconductor device as exemplarily described above with respect to FIGS. 1, 2A-2D and 10A-10D. Although the electronic system 300 is illustrated as including only one controller 310, it will be appreciated that the electronic system 300 may include more than one controller 310.

In one embodiment, the input/output device 320 may include at least one selected from the group consisting of a keypad, a keyboard, a display device, or the like or a combination thereof. Although the electronic system 300 is illustrated as including only one input/output device 320, it will be appreciated that the electronic system 300 may include more than one input/output device 320.

In one embodiment, the memory 330 may be configured to store data and/or instructions to be executed by the controller 310. The memory 330 may include a plurality of memory devices included within a semiconductor device as exemplarily described above with respect to FIGS. 1, 2A-2D and 10A-10D. Thus, the memory 330 may be incorporated within a semiconductor device as exemplarily described above with respect to FIGS. 1, 2A-2D and 10A-10D. In one embodiment, the memory 330 and the controller 310 may be incorporated within the same semiconductor device. Although the electronic system 300 is illustrated as including only one memory 330, it will be appreciated that the electronic system 300 may include more than one memory 330.

In one embodiment, the electronic system 300 may further include an interface 340 that allows transmitting data to or receiving data from a communication network. The interface 340 can be a wired-type interface, a wireless-type interface, or a combination thereof. In one embodiment, the interface 340 can include an antenna or a wired/wireless transceiver.

Constructed as exemplarily described above, the electronic system 300 can be provided as a mobile system, personal computer, industrial computer, or other system capable of performing any function. For example, a mobile system can be a Personal Digital Assistant (PDA), a hand-held computer, web tablet, a mobile telephone, a wireless telephone, a laptop computer, a memory card, a digital music system, a system for transmitting/receiving information, or the like or a combination thereof. In embodiments where the electronic system 300 is capable of capable of wireless communication, communication interface protocols such as CDMA, GSM, NADC, E-TDMA, WCDAM, and CDMA2000 may be used by the electronic system 300.

Figure 15:
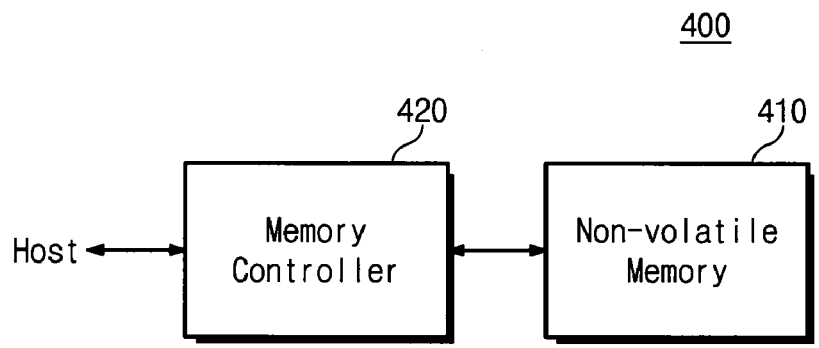
FIG. 15 is a block diagram schematically illustrating a memory card incorporating a semiconductor device, according to one embodiment.

FIG. 15 is a block diagram schematically illustrating a memory card incorporating a semiconductor device, according to one embodiment.

Referring to FIG. 15, a memory card 400 may, for example, include a non-volatile memory 410 and a memory controller 420. The non-volatile memory 410 may be configured to store data and/or read stored data. In one embodiment, the non-volatile memory 410 may include a plurality of memory devices (e.g., flash memory devices) included within a semiconductor device as exemplarily described above with respect to FIGS. 1, 2A-2D and 10A-10D. Thus, the non-volatile memory 410 may be incorporated within a semiconductor device as exemplarily described above with respect to FIGS. 1, 2A-2D and 10A-10D. The memory controller 420 may be configured to control data retrieval and/or data storage operations of the non-volatile memory 410 in response to read/write requests from a host. In one embodiment, the memory controller 420 may include a plurality of logic devices included within a semiconductor device as exemplarily described above with respect to FIGS. 1, 2A-2D and 10A-10D. Thus, the memory controller 420 may be incorporated within a semiconductor device as exemplarily described above with respect to FIGS. 1, 2A-2D and 10A-10D. In one embodiment, the non-volatile memory 410 and the memory controller 420 may be incorporated within the same semiconductor device.

The foregoing is illustrative of example embodiments and is not to be construed as limiting thereof. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims.

What is claimed is:

1. A semiconductor device comprising:
    a lower level device layer located over a semiconductor substrate, the lower level device layer including a plurality of devices formed in the substrate;
    an interlayer insulating film located over the lower level device layer; and
    an upper level device layer located over the interlayer insulating film, the upper level device layer including a plurality of semiconductor patterns and at least one device formed in each of the plurality of semiconductor patterns, wherein the plurality of semiconductor patterns are isolated from each other, wherein each of the plurality of semiconductor patterns comprises:
- at least one active portion; and
- at least one body contact portion electrically connected to the at least one active portion, wherein each of the plurality of semiconductor patterns further comprises:
- at least one recess region formed between the at least one active portion and the at least one body contact portion; and
- at least one connector portion disposed under the at least one recess region, wherein the at least one connector portion electrically connects the at least one active portion and the at least one body contact portion to each other, and wherein the at least one active portion, the at least one body contact portion and the at least one connector portion are doped with a dopant having the same conductivity type.

2. The semiconductor device of claim 1, wherein at least one device formed in one of the plurality of semiconductor patterns includes a transistor and wherein a distance between a side surface of the one of the plurality of semiconductor patterns and another one of the plurality of semiconductor patterns adjacent thereto is about 15% to about 40% of a channel length of the transistor.

3. The semiconductor device of claim 1, further comprising a dielectric material interposed between side surfaces of adjacent ones of the plurality of semiconductor patterns.

4. The semiconductor device of claim 3, wherein a distance between the side surfaces of the adjacent ones of the plurality of semiconductor patterns is greater than a thickness at which the dielectric material breaks down in the presence of a voltage applied to a device formed in at least one of the adjacent ones of the plurality of semiconductor patterns.

5. The semiconductor device of claim 1, further comprising a dielectric material disposed within the at least one recess region.

6. The semiconductor device of claim 1, wherein the at least one active portion, the at least one body contact portion and the at least one connector portion are disposed sequentially along one direction.

7. The semiconductor device of claim 6, wherein a length of the at least one connector portion along another direction perpendicular to the one direction is less than or substantially equal to a length of at least one of the at least one body contact portion and the at least active portion along the other direction.

8. The semiconductor device of claim 6, wherein a length of the at least one body contact portion along a second direction perpendicular to the first direction is less than or substantially equal to a length of the at least one active portion along the second direction.

9. The semiconductor device of claim 1, wherein the at least one connector portion comprises:
- a first part connected to the at least one active portion; and
- a second part connected to the first part and the at least one body contact portion, wherein the first part and the second part extend along different directions.

10. The semiconductor device of claim 1, wherein the at least one active portion, the at least one body contact portion and the at least one connector portion are doped with substantially the same concentration of the dopant.

11. The semiconductor device of claim 1, further comprising a body contact doped region formed in an upper portion of the at least one body contact portion, wherein a concentration of the dopant in the body contact doped region is greater than a concentration of the dopant in the at least one body contact portion.

12. The semiconductor device of claim 1, wherein the plurality of devices included in the lower level device layer include at least one selected from the group consisting of a memory cell, a driving transistor and a logic device.

13. The semiconductor device of claim 1, wherein the plurality of devices included in the upper level device layer include at least one selected from the group consisting of a memory cell, a driving transistor and a logic device.

14. The semiconductor device of claim 13, wherein the plurality of devices included in the upper level device layer include at least one memory cell having a charge storage pattern.

15. The semiconductor device of claim 14, wherein the charge storage pattern of the at least one memory cell includes a floating gate pattern or a trap insulating pattern.

16. The semiconductor device of claim 13, wherein the plurality of devices included in the upper level device layer include a first driving transistor and a second driving transistor.

17. The semiconductor device of claim 16, wherein each of the first driving transistor and the second driving transistor includes a gate insulating film and wherein the gate insulating film of the first driving transistor is thicker than the gate insulating film of the second driving transistor.

18. The semiconductor device of claim 1, further comprising:
- at least one additional device layer disposed between the interlayer insulating film and the upper level device layer, disposed over the upper level device layer, or a combination thereof, wherein the at least one additional device layer includes a plurality of semiconductor patterns and at least one device formed in each of the plurality of semiconductor patterns.

19. The semiconductor device of claim 1, wherein a bottom surface of the active portion and a bottom surface of the body contact portion contact a top surface of the interlayer insulating film.

20. The semiconductor device of claim 1, wherein a top surface of the active portion and a top surface of the body contact portion are of substantially same height.

21. An electronic system comprising:
- at least one input/output device;
- a memory device configured to store data;
- a communications interface configured to transmit and/or receive data from an external device;
- a controller configured to control an operation of at least one of the input/output device, the memory device and the communications interface; and
- a bus, wherein the controller, the input/output device, the memory device and the communications interface are communicatively coupled to each other via the bus, wherein at least one of the memory device and the controller are incorporated within a semiconductor device according to claim 1.

22. The electronic system of claim 21, wherein the memory device and the controller are incorporated within the same semiconductor device.

23. The electronic system of claim 21, wherein the at least one input/output device comprises a mouse, a keypad, a keyboard, a display device, a printer, or a combination thereof.

24. The electronic system of claim 21, wherein the communications interface comprises a wired communications interface, a wireless communications interface, or a combination thereof.

25. The electronic system of claim 21, wherein the communications interface is configured to transmit and/or receive data according to protocols including CDMA, GSM, NADC, E-TDMA, WCDAM, CDMA2000, or a combination thereof.

26. The electronic system of claim 21, wherein the electronic system is provided as a personal digital assistant, a personal computer, a Web tablet, a mobile phone, a wireless phone, a laptop computer, a memory card, a digital music system.

27. A memory card, comprising:
a memory device configured to store data; and
a controller configured to control an operation of a semiconductor memory device,
wherein at least one of the memory device and the controller are incorporated within a semiconductor device according to claim 1.

28. The memory card of claim 27, wherein the memory device and the controller are incorporated within a same semiconductor device.

29. The memory card of claim 27, wherein the controller is configured to transmit data to the semiconductor memory device, to receive instructions from a host, to transmit data from the semiconductor memory device to the host or a combination thereof.

* * * * *